(12) United States Patent
Pfirsch et al.

(10) Patent No.: US 8,643,086 B2
(45) Date of Patent: *Feb. 4, 2014

(54) SEMICONDUCTOR COMPONENT WITH HIGH BREAKTHROUGH TENSION AND LOW FORWARD RESISTANCE

(75) Inventors: Frank Dieter Pfirsch, Munich (DE); Armin Willmeroth, Augsburg (DE); Anton Mauder, Kolbermoor (DE); Stefan Sedlmaier, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/367,909

(22) Filed: Feb. 7, 2012

(65) Prior Publication Data

US 2012/0132956 A1      May 31, 2012

Related U.S. Application Data

(63) Continuation of application No. 11/435,979, filed on May 17, 2006, now Pat. No. 8,110,868.

(30) Foreign Application Priority Data

Jul. 27, 2005 (DE) .......................... 10 2005 035 153
Aug. 19, 2005 (DE) .......................... 10 2005 039 331

(51) Int. Cl.
    *H01L 29/78* (2006.01)
(52) U.S. Cl.
    USPC ............. 257/328; 257/E29.012; 257/E29.257
(58) Field of Classification Search
    USPC .................. 257/328, 341, E29.012, E29.257, 257/E21.418
    See application file for complete search history.

(56) References Cited

U.S. PATENT DOCUMENTS

| 568,928 A | 10/1896 | Stratton et al. |
| 3,763,406 A | 10/1973 | Bosselaar |

(Continued)

FOREIGN PATENT DOCUMENTS

| DE | 4309764 | 9/1994 |
| DE | 19606983 | 8/1997 |

(Continued)

OTHER PUBLICATIONS

Non-Final Office Action mailed Sep. 8, 2008 in U.S. Appl. No. 11/435,979.

(Continued)

*Primary Examiner* — Tom Thomas
*Assistant Examiner* — Christopher M Roland
(74) *Attorney, Agent, or Firm* — Dicke, Billig & Czaja, PLLC

(57) ABSTRACT

A semiconductor component having a semiconductor body is disclosed. In one embodiment, the semiconductor component includes a drift zone of a first conductivity type, a drift control zone composed of a semiconductor material which is arranged adjacent to the drift zone at least in places, a dielectric which is arranged between the drift zone and the drift control zone at least in places. A quotient of the net dopant charge of the drift control zone, in an area adjacent to the accumulation dielectric and the drift zone, divided by the area of the dielectric arranged between the drift control zone and the drift zone is less than the breakdown charge of the semiconductor material in the drift control zone.

45 Claims, 23 Drawing Sheets

(56) References Cited

U.S. PATENT DOCUMENTS

| | | |
|---|---|---|
| 4,754,310 A | 6/1988 | Coe |
| 4,774,560 A | 9/1988 | Coe |
| 4,903,189 A | 2/1990 | Ngo et al. |
| 4,907,056 A | 3/1990 | Goesele et al. |
| 4,941,026 A | 7/1990 | Temple |
| 5,032,878 A | 7/1991 | Davies et al. |
| 5,075,739 A | 12/1991 | Davies |
| 5,216,275 A | 6/1993 | Chen |
| 5,237,193 A | 8/1993 | Williams et al. |
| 5,386,136 A | 1/1995 | Williams et al. |
| 5,430,324 A | 7/1995 | Bencuya |
| 5,438,215 A | 8/1995 | Tihanyi |
| 5,689,128 A | 11/1997 | Hshieh et al. |
| 5,844,272 A | 12/1998 | Soderbarg et al. |
| 5,889,314 A | 3/1999 | Hirabayashi |
| 5,973,359 A | 10/1999 | Kobayashi et al. |
| 5,981,996 A | 11/1999 | Fujishima |
| 6,064,103 A | 5/2000 | Pfirsch |
| 6,184,555 B1 | 2/2001 | Tihanyi et al. |
| 6,201,279 B1 | 3/2001 | Pfirsch |
| 6,259,134 B1 | 7/2001 | Amaratunga et al. |
| 6,362,505 B1 | 3/2002 | Tihanyi |
| 6,373,098 B1 | 4/2002 | Brush et al. |
| 6,504,697 B1 | 1/2003 | Hille |
| 6,555,872 B1 | 4/2003 | Dennen |
| 6,605,862 B2 | 8/2003 | Van Dalen et al. |
| 6,635,944 B2 | 10/2003 | Stoisiek |
| 6,717,230 B2 | 4/2004 | Kocon |
| 6,774,434 B2 | 8/2004 | Hueting et al. |
| 6,853,033 B2 | 2/2005 | Liang et al. |
| 6,872,611 B2 | 3/2005 | Takemori et al. |
| 6,914,297 B2 | 7/2005 | Deboy et al. |
| 6,921,941 B2 | 7/2005 | Nishiwaki et al. |
| 6,953,968 B2 | 10/2005 | Nakamura et al. |
| 7,064,384 B2 | 6/2006 | Hara et al. |
| 7,238,576 B2 | 7/2007 | Yamaguchi et al. |
| 7,250,639 B1 | 7/2007 | Suekawa |
| 7,304,354 B2 | 12/2007 | Morris |
| 7,821,033 B2 | 10/2010 | Sedlmaier |
| 8,461,648 B2 * | 6/2013 | Pfirsch et al. ............... 257/341 |
| 2003/0073287 A1 | 4/2003 | Kocon |
| 2003/0094649 A1 | 5/2003 | Hueting et al. |
| 2004/0043565 A1 | 3/2004 | Yamaguchi et al. |
| 2004/0084721 A1 | 5/2004 | Kocon et al. |
| 2004/0094799 A1 | 5/2004 | Nakamura |
| 2004/0129973 A1 | 7/2004 | Saito et al. |
| 2005/0045960 A1 | 3/2005 | Takahashi |
| 2005/0082591 A1 | 4/2005 | Hirler et al. |
| 2005/0085591 A1 | 4/2005 | Dozeman et al. |
| 2005/0253170 A1 | 11/2005 | Akiyama |
| 2006/0097313 A1 | 5/2006 | Yanagisawa et al. |
| 2007/0023830 A1 | 2/2007 | Pfirsch et al. |
| 2007/0108513 A1 | 5/2007 | Rub et al. |
| 2008/0197441 A1 | 8/2008 | Mauder et al. |
| 2008/0265320 A1 | 10/2008 | Mauder et al. |
| 2009/0189216 A1 | 7/2009 | Werner et al. |
| 2009/0321804 A1 | 12/2009 | Mauder et al. |
| 2009/0322417 A1 | 12/2009 | Hirler et al. |
| 2010/0078694 A1 | 4/2010 | Willmeroth et al. |
| 2012/0132956 A1 | 5/2012 | Pfirsch et al. |

FOREIGN PATENT DOCUMENTS

| | | |
|---|---|---|
| DE | 19854915 | 6/2000 |
| DE | 10301939 | 9/2004 |
| DE | 102004041198 | 3/2006 |
| DE | 102005044165 | 3/2007 |
| EP | 1073123 | 1/2001 |
| EP | 1107123 | 6/2001 |
| EP | 1170803 | 1/2002 |
| EP | 1300886 | 4/2003 |
| EP | 1453105 | 9/2004 |
| GB | 2089118 | 6/1982 |
| JP | 2000-208757 | 7/2000 |
| JP | 2003-298053 | 10/2003 |
| JP | 2004193212 | 7/2004 |
| JP | 2005-510059 | 4/2005 |
| WO | 02067332 | 8/2002 |
| WO | 03043089 | 5/2003 |
| WO | 2004090973 | 10/2004 |
| WO | 2004107449 | 12/2004 |
| WO | 2005065385 | 7/2005 |
| WO | 2007012490 | 2/2007 |

OTHER PUBLICATIONS

Final Office Action mailed Jun. 10, 2009 in U.S. Appl. No. 11/435,979.
Notice of Allowance mailed Aug. 18, 2011 in U.S. Appl. No. 11/435,979.
Claim recitation for U.S. Appl. No. 11/706,860, filed Feb. 19, 2009.
PCT International Search Report for PCT Application No. PCT/EP2006/007450 mailed Jul. 4, 2007 (23 pgs.).
Fujihira et al., "Simulated Superior Performances of Semiconductor Superjunction Devices", ISPSD, 12.4, pp. 423-426 (1998).
Contiero et al., "Progress in Power ICs and MEMs, 'Analog' Technologies to Interface the Real World", ISPSC, 1, pp. 3-12 (2004).
Presentation of Symmorphix: "Symmorphix=Amorphous Oxide Films A 'Moore's Law' Platform for Passive Integration, Flexible Electronics, & Energy Storage", Dr. Ernest Demaray, (Mar. 2005).
Notice of Allowance mailed Nov. 23, 2012 in U.S. Appl. No. 11/996,906.

* cited by examiner

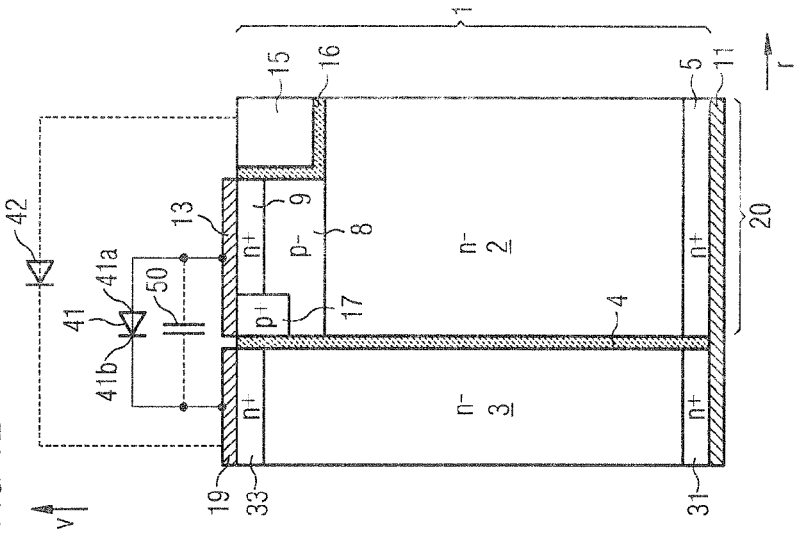
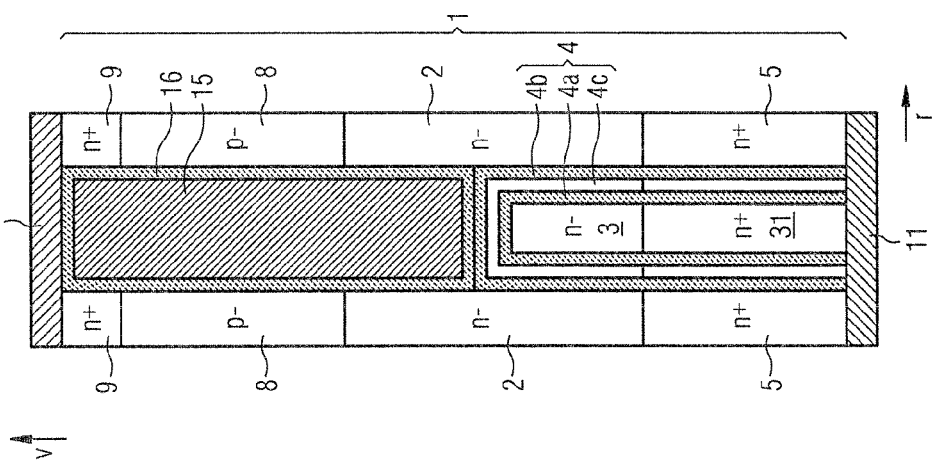

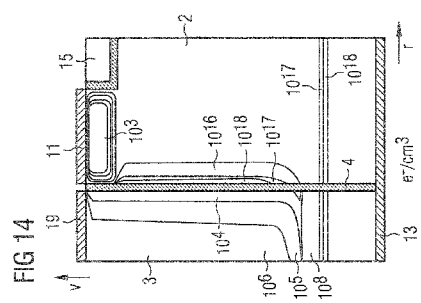
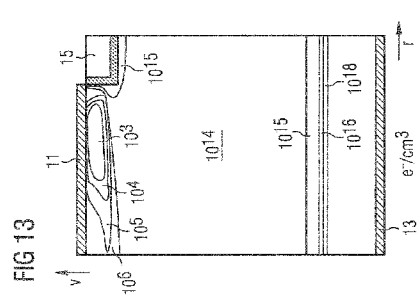
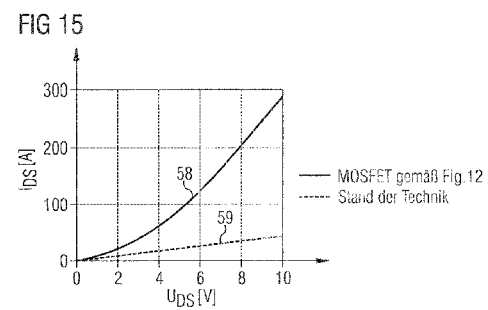
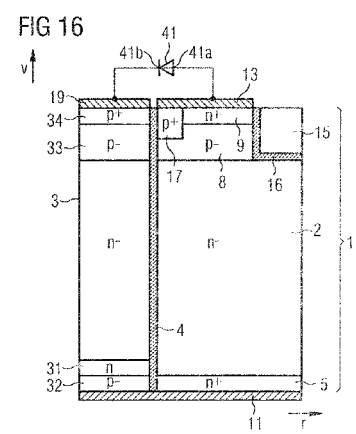

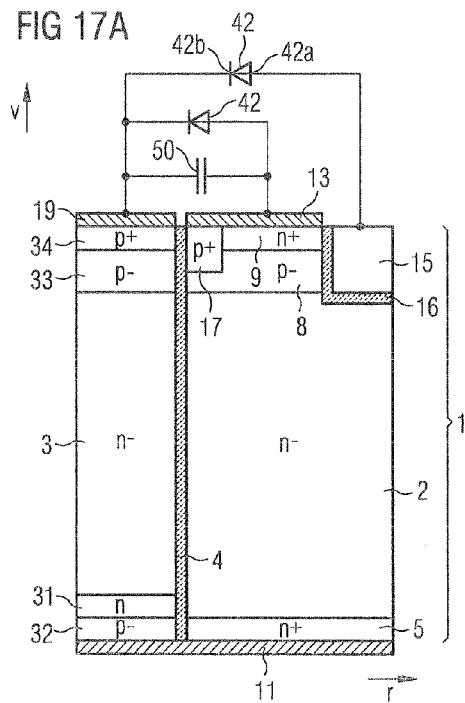
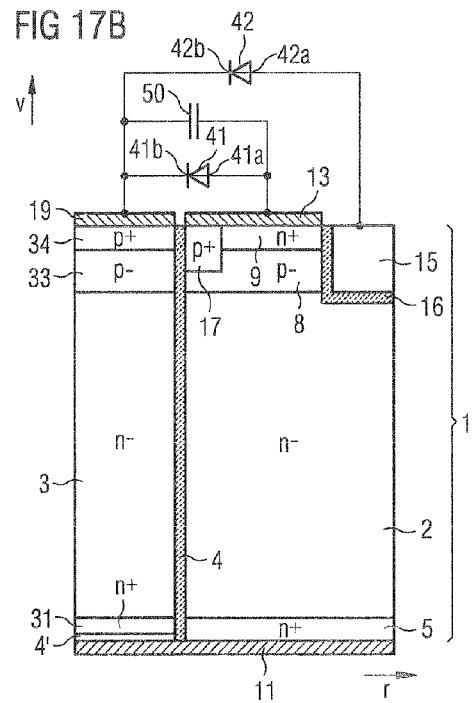
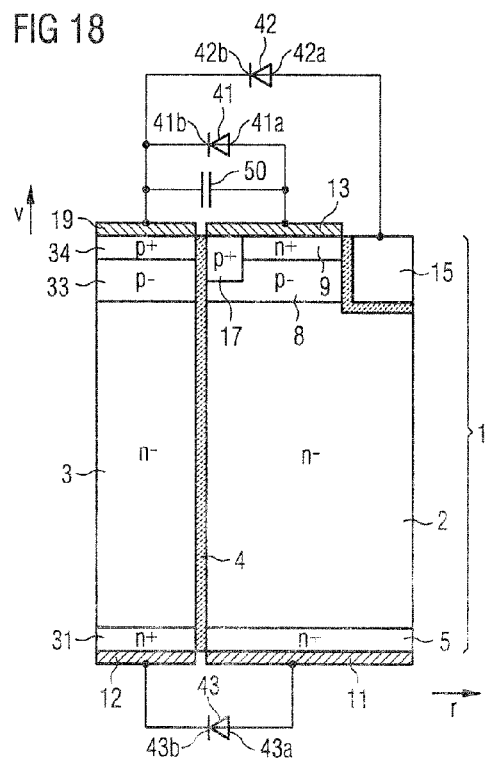
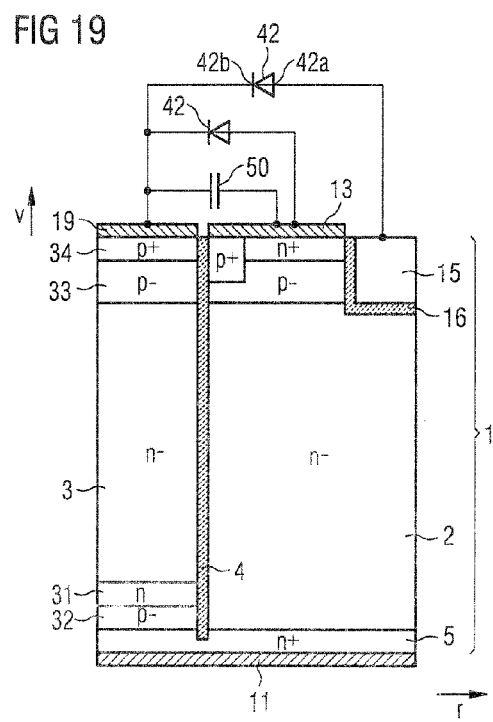

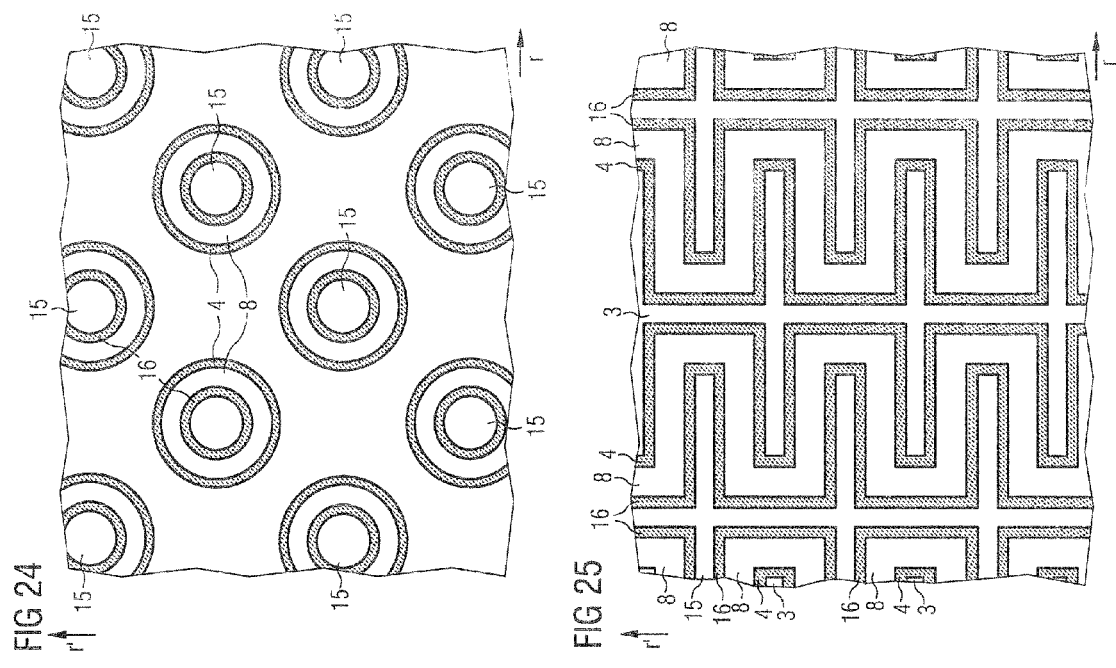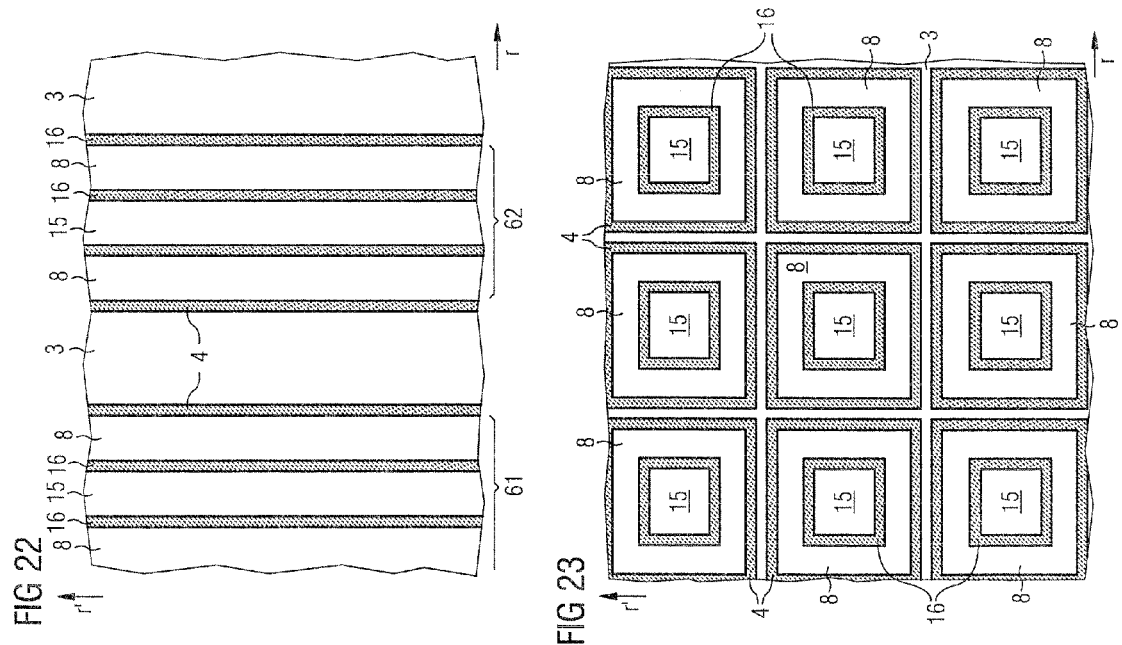

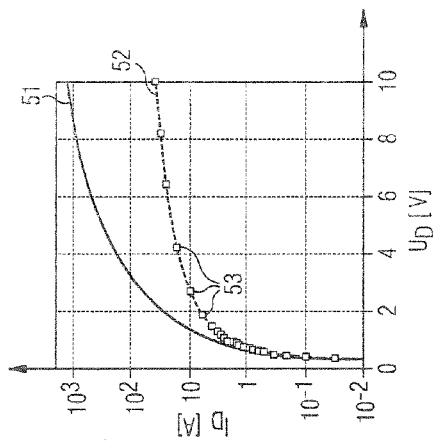
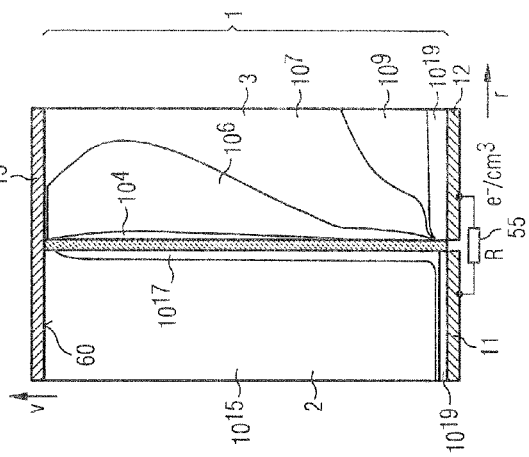
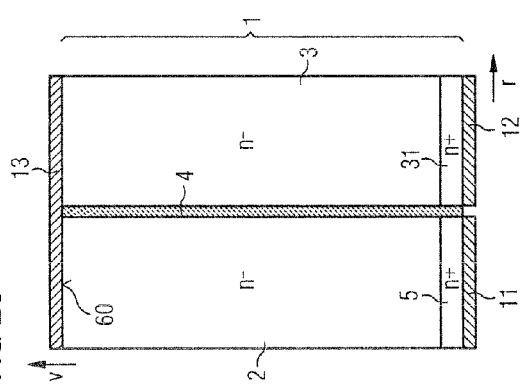
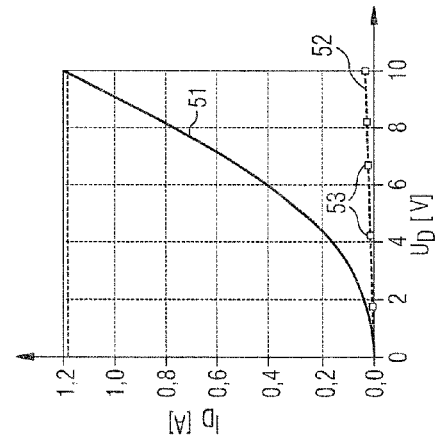

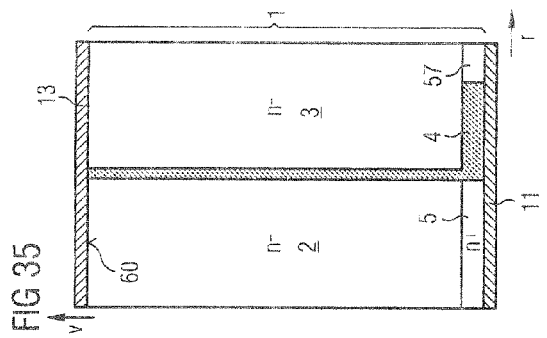
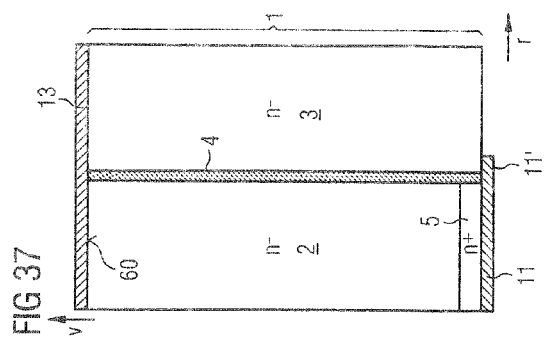
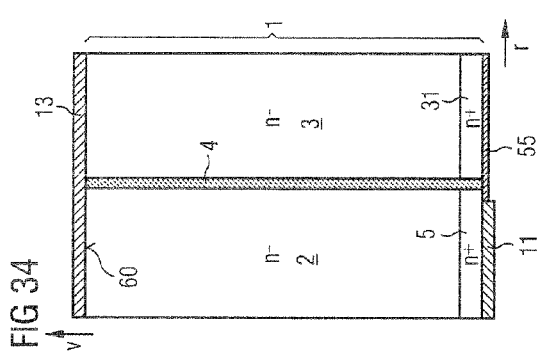
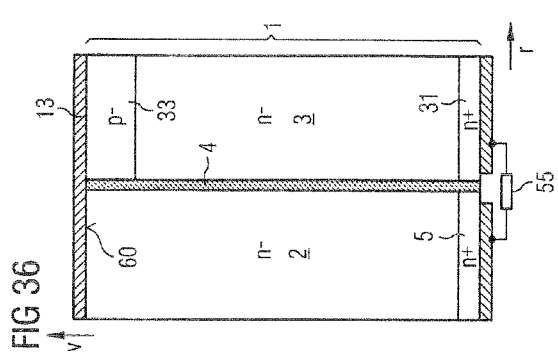
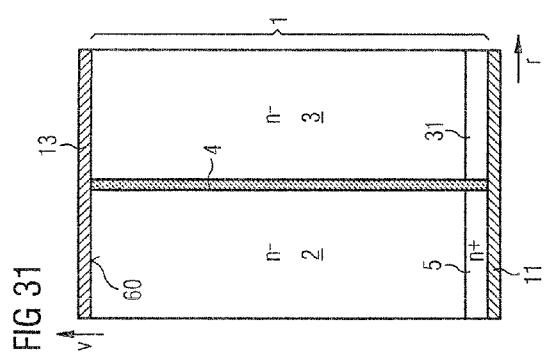
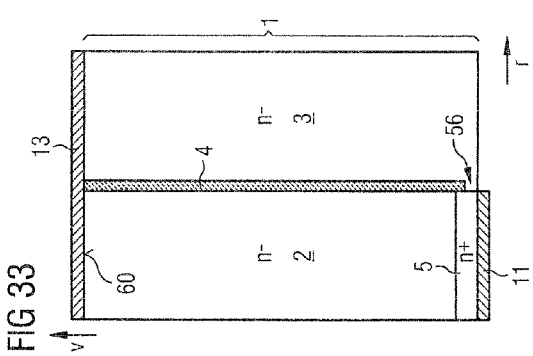
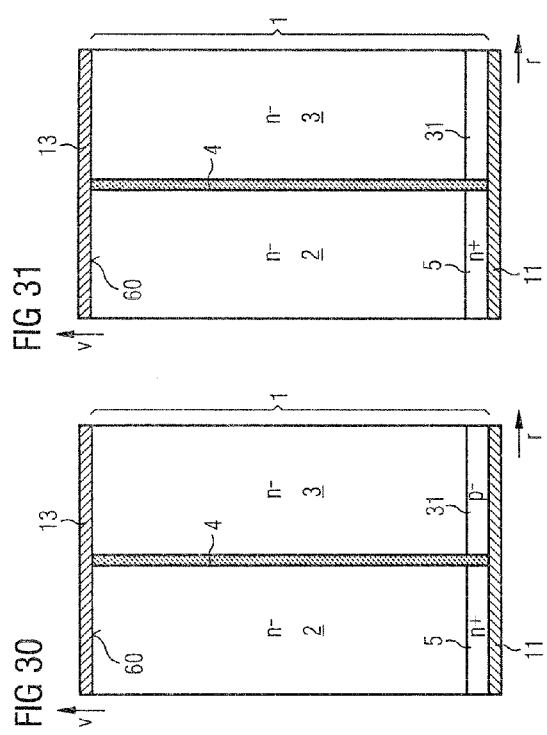
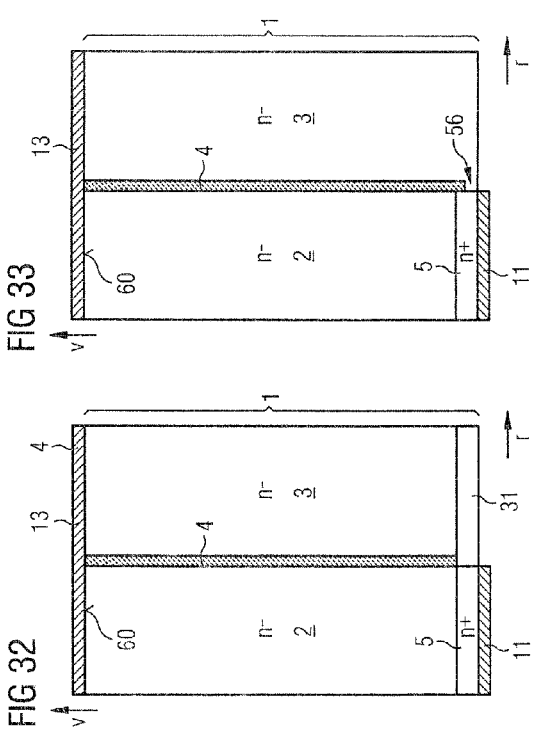

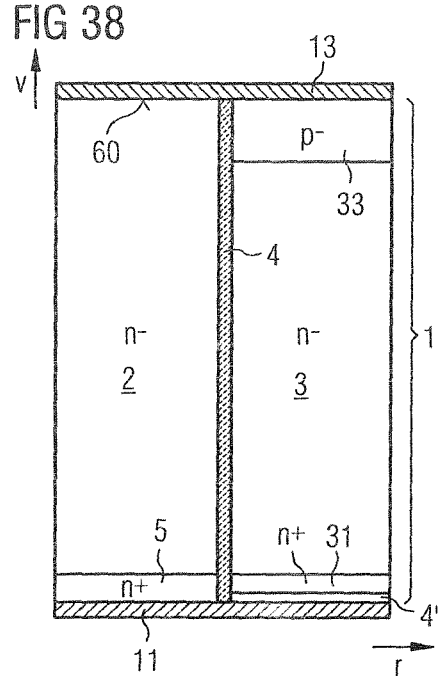
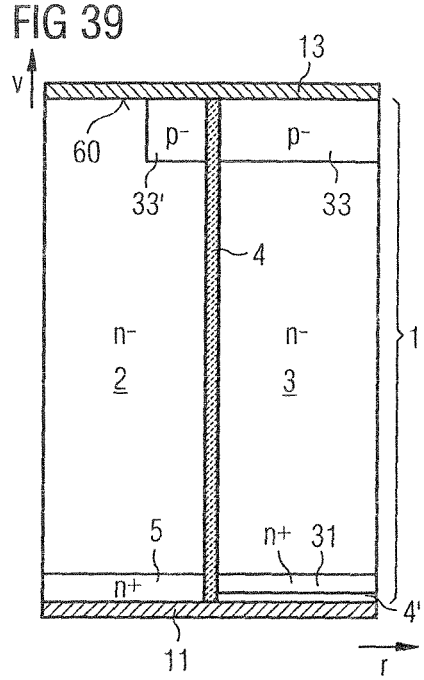
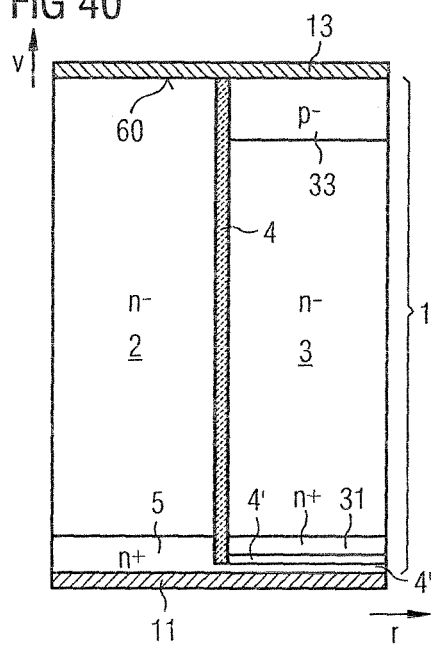

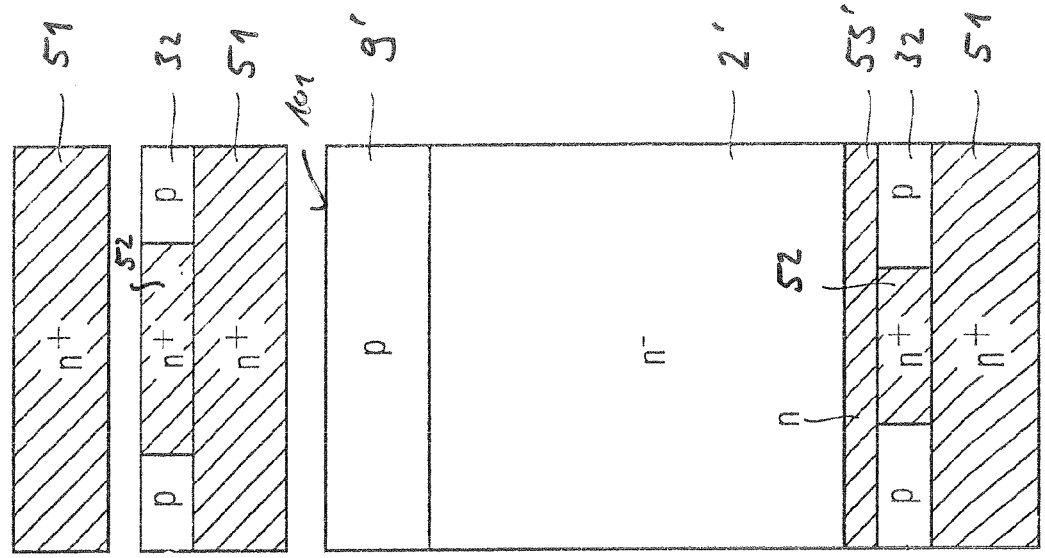
FIG 46A
FIG 46B
FIG 46C
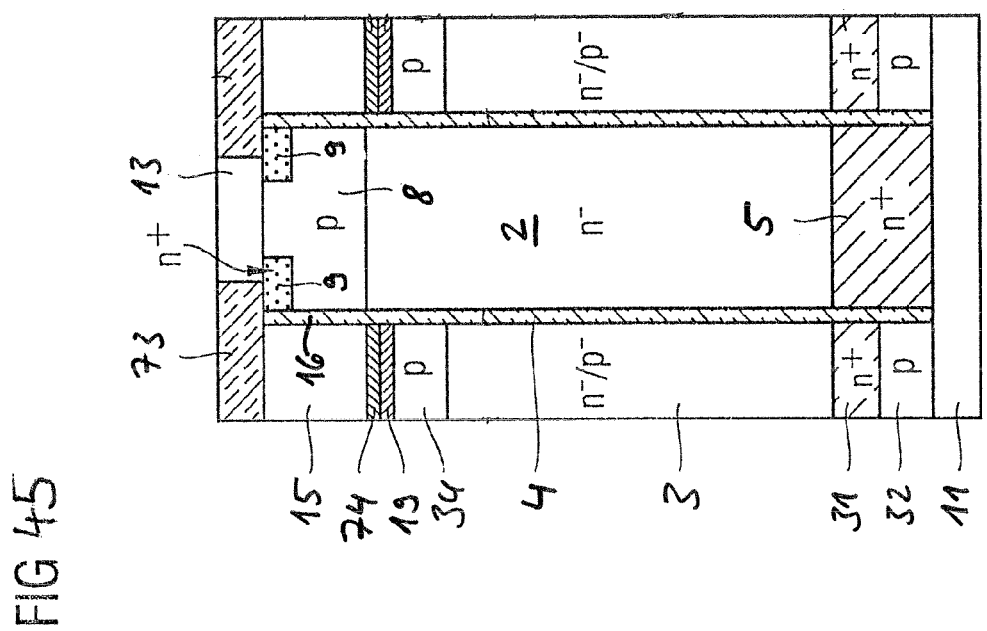
FIG 45

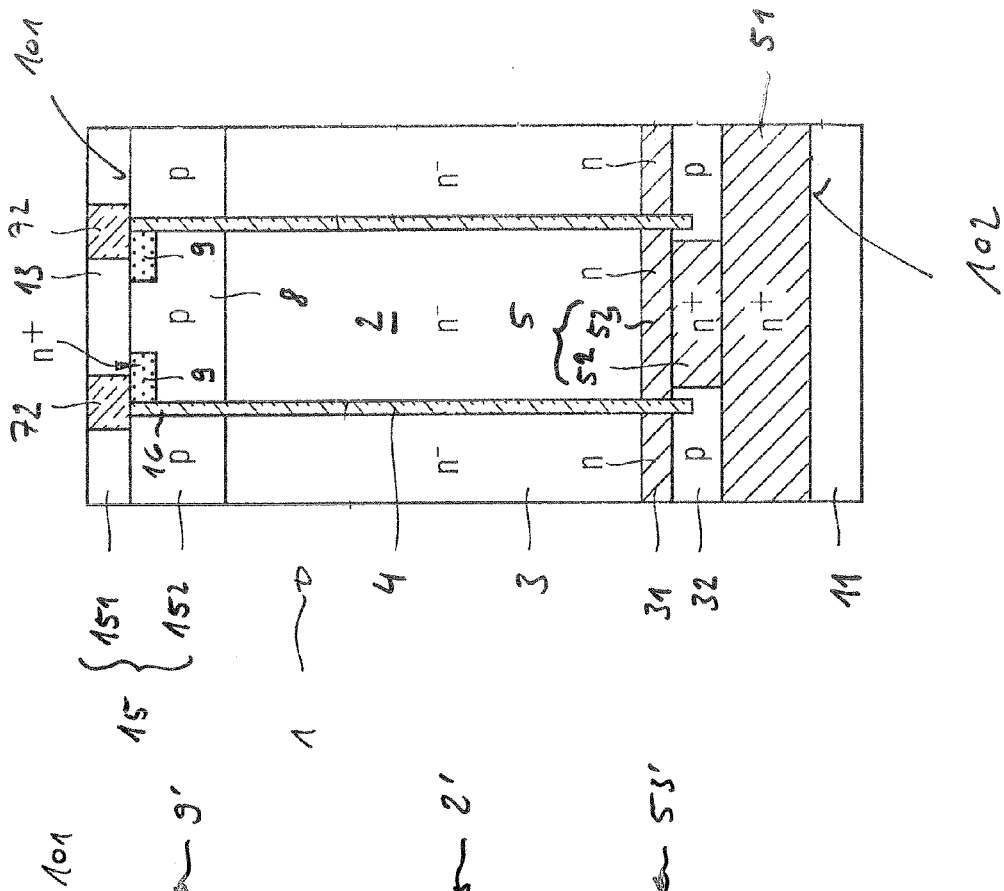
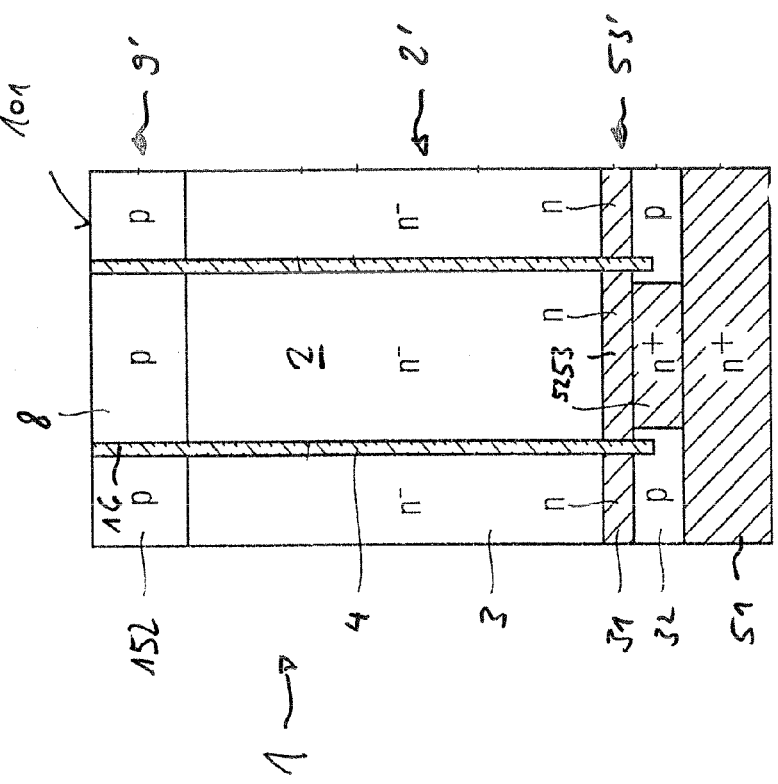

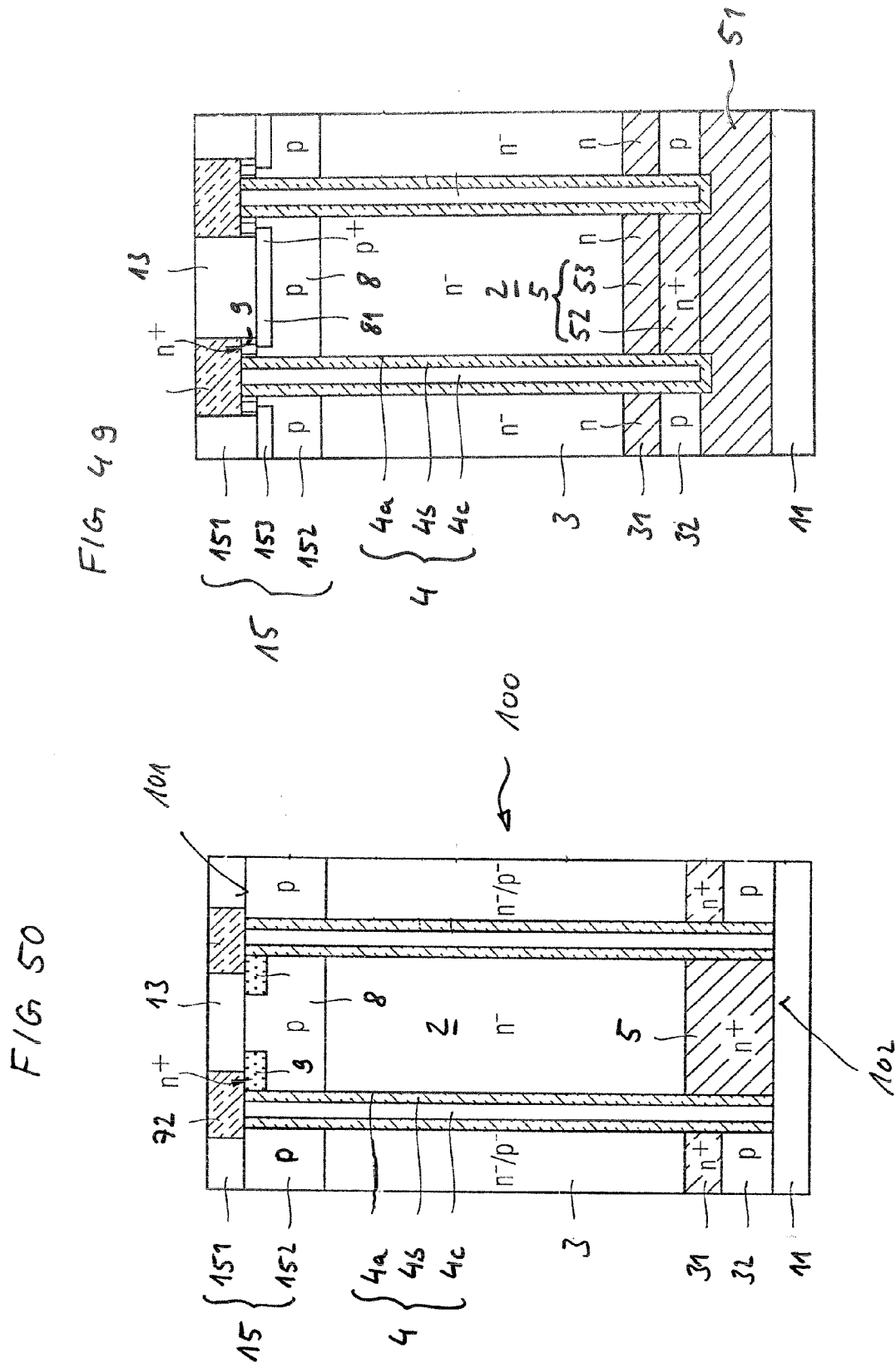

SEMICONDUCTOR COMPONENT WITH HIGH BREAKTHROUGH TENSION AND LOW FORWARD RESISTANCE

CROSS-REFERENCE TO RELATED APPLICATIONS

This Continuation Patent Application claims priority to U.S. patent application Ser. No. 11/435,979, filed on May 17, 2006, and claims priority to German Patent Application No. 10 2005 035 153.0, filed on Jul. 27, 2005, and German Application No. 10 2005 039 331.4, filed on Aug. 19, 2005, all of which are incorporated herein by reference.

FIELD OF THE INVENTION

The invention relates to a semiconductor component, in particular to a power semiconductor component, with a low on-state resistance.

BACKGROUND OF THE INVENTION

One important aim in the development of power semiconductor components is to produce components with as high a blocking capability as possible, which would nevertheless have a low on-state resistance and have switching losses which are as low as possible at the same time.

One possible way to reduce the on-state resistance of a power semiconductor component for a given blocking capability is to use the compensation principle, which is described by way of example in U.S. Pat. No. 4,754,310 (Coe), U.S. Pat. No. 5,216,275 A1 (Chen), U.S. Pat. No. 5,438,215 or DE 43 09 764 C2 (Tihanyi). The compensation principle envisages the provision of semiconductor zones with complementary doping to one another in the drift zone of a power semiconductor component, which semiconductor zones mutually clear out charge carriers in the blocking state. However, as the magnitudes of the structure widths are reduced to an ever greater extent, the compensation principle is reaching its limits, since the drift zone has to have a minimum width in the direction transverse with respect to the current flow direction for correct operation.

The on-state resistance of a power semiconductor component can also be reduced by providing heavier doping in the drift zone and by arranging a field electrode adjacent to the drift path in the component, which field electrode in the case of a component which is driven such that it is in the blocking state produces an opposing charge to the charge which is present in the drift zone and results from the doping. This opposing charge compensates for charge carriers in the drift zone, so that heavier doping is possible in the drift zone, and thus a lower on-state resistance, for a given blocking voltage, or a higher blocking voltage is possible for a given doping. Components such as these are described, for example, in U.S. Pat. No. 4,903,189 (Ngo), U.S. Pat. No. 4,941,026 (Temple), U.S. Pat. No. 6,555,873 B2 (Disney), U.S. Pat. No. 6,717,230 B2 (Kocon), U.S. Pat. No. 6,853,033 B2 (Liang). One problem in this case is that the voltages which can occur across the isolation layer between the drift zone and the field electrode when the component is in the blocking state are high in some circumstances, so that this isolation layer must be appropriately thick in order to have an adequate withstand voltage. However, this adversely affects the accumulation response.

EP 1 073 123 A2 (Yasuhara) describes a lateral power MOSFET which has a plurality of auxiliary electrodes arranged in a drift zone of the component and isolated from the drift zone by a dielectric. These auxiliary electrodes are composed of a semi-insulating polysilicon (SIPOS), a resistance material, and are connected between a source connection and a drain connection of the component. The auxiliary electrodes result in the formation of a depletion zone (depletion layer) in the drift zone when the component is driven in the blocking state.

GB 2 089 118 A describes a power MOSFET which has a resistance layer which extends along the drift zone between a gate electrode and a drain electrode and "spreads" an electric field in the drift zone, with the aim of increasing the withstand voltage.

U.S. Pat. No. 5,844,272 (Söderbärg) describes a lateral radio-frequency transistor with a drift zone running in the lateral direction of a semiconductor body and with a further semiconductor zone which is arranged adjacent to the drift zone above the semiconductor body and is isolated from the drift zone by an isolation layer. This further semiconductor zone is connected to the drain zone via a diode and results in the formation of an accumulation channel in the drift zone along the isolation layer when the component is in the on state.

US 2003/0073287 A1 (Kocon) proposes that a plurality of field electrodes, which are at different potentials, be provided along the drift path. However, this is very complex to implement.

In the case of an IGBT (Insulated Gate Bipolar Transistor), the on-state resistance is reduced by flooding the drift part by means of additional injection of a second charge carrier type. However, this results in considerably higher switching losses since these additional charge carriers must be removed again when the component is switched off.

The object of the present invention is to provide a semiconductor component, in particular a power semiconductor component, with a drift path, which component has a low on-state resistance and in which the disadvantages mentioned above do not occur.

SUMMARY OF THE INVENTION

In one embodiment, the semiconductor component according to the invention has a drift zone and a drift control zone composed of a semiconductor material in a semiconductor body, with the drift control zone being arranged adjacent to the drift zone at least in places, and with an accumulation dielectric being arranged between the drift zone and the drift control zone. In this component, the drift control zone is used to control a conductive channel in the drift zone, and is doped such that the quotient of the net dopant charge of the drift control zone in a volume, which is adjacent to the accumulation dielectric in a direction at right angles to the accumulation dielectric, divided by the area of the accumulation dielectric is less than the breakdown charge of the semiconductor material in the drift control zone.

In one embodiment, the semiconductor component according to the invention is a unipolar power semiconductor component, such as a power MOSFET or a power Schottky diode. A drift control zone which is composed of a semiconductor material and is adjacent to a drift zone may, however, also be provided in bipolar components.

Power semiconductor components such as these have a semiconductor region in which, when a blocking voltage is applied to the component, this blocking voltage is dissipated. This semiconductor region is referred to differently depending on the nature of the relevant component. By way of example, drift zone, drift path or base (n base or p base) have become established as normal terms. This semiconductor region is referred to in the following text as the "drift zone", without any restriction to generality.

Suitable electrical linking of the drift control zone to the drift zone results in the drift control zone, which is at a different potential to that of the drift zone, forming an electric field which influences charge carriers in the drift zone in such a manner that this results in a channel-like major increase in the charge carrier density on the side of the drift zone facing the drift control zone, at least when the component is being operated in the forward direction. In the case of a semiconductor component which is switched by means of a gate which controls an MOS channel, the charge carrier species in the MOS channel and in the accumulation layer in the drift region are the same. Otherwise, both electrons and holes are suitable for formation of this accumulation layer at the accumulation end of the drift zone. The charge carrier species depends on the potential on the drift control zone with respect to the drift zone, and is not governed by the doping of the drift control zone and drift zone.

This accumulation of the charge carriers in the drift zone makes it possible to increase by a plurality of times the current carrying capacity of the component in comparison to the current carrying capacity of a conventional component with the same cross-sectional area at right angles to the main current direction, although, in the steady state, the current is transported only in the drift zone, and thus only in a portion of the power semiconductor.

The drift control zone may be doped to be both identical and to be complementary to the drift zone. Mixed dopings are also possible, that is to say the drift zone and the drift control zones may have p doping in places, and n doping in places.

One advantageous aspect of the component according to the invention is that the profile of the electric field in the drift zone is not significantly influenced by the drift control zone, even when the component is in the blocking state, when high blocking voltages are applied, at least when the drift zone and the drift control zone have similar dopant concentration profiles. In particular, the drift control zone should be designed such that it can be cleared laterally, that is to say in the direction at right angles to the dielectric, and such that the vertical extent of the space charge zone is similar in the drift control zone and in the drift zone.

BRIEF DESCRIPTION OF THE DRAWINGS

The invention will be explained in the following text using preferred exemplary embodiments and with reference to the figures.

FIG. 11 illustrates a section of a vertical MOSFET as illustrated in FIG. 8, in which the dielectric arranged between the drift zone and the drift control zone has two layer elements, between which air or a material with a low dielectric constant is arranged.

FIG. 12 illustrates a cross section through a section of a MOSFET with a drift control zone which, together with heavily n-doped connection zones adjacent to the drift control zone on the source side and drain side, form a junction field-effect transistor, with the drift control zone being connected to the source zone via a first diode.

FIG. 13 illustrates an example of the profile of the electron distribution of an on-state MOSFET according to the prior art.

FIG. 14 illustrates an example of the profile of the electron distribution in an on-state MOSFET according to the invention as illustrated in FIG. 12.

FIG. 15 illustrates a graph comparing the profile of the drain-source current in a MOSFET according to the prior art and the profile of the drain-source current in a MOSFET according to the invention as illustrated in FIG. 12, as a function of the drain-source voltage $U_{DS}$.

FIG. 16 illustrates a cross section through a section of a MOSFET according to the invention as illustrated in FIG. 12, in which the drift control zones are connected on the source side to the source zone by means of a lightly p-doped connection zone followed by a heavily p-doped connection zone, and are connected to the drain zone by means of a p-doped connection zone.

FIG. 17a illustrates the MOSFET as illustrated in FIG. 16, in which the source zones and the drift control zones are connected via a capacitor, and in which the drift control zones and the gate electrodes are connected to one another via a second diode.

FIG. 17b illustrates a MOSFET modified with respect to the MOSFET illustrated in FIG. 17a, in which the drift control zone is coupled to a drain electrode via a tunnel dielectric, at least in places.

FIG. 18 illustrates the MOSFET as illustrated in FIGS. 16 and 17, which is connected to a first diode as illustrated in FIG. 16 and to a second diode and a capacitor as illustrated in FIG. 17a, and in which the drift control zones are connected on the drain side to the drain zones by means of a third diode.

FIG. 19 illustrates the MOSFET with the circuit arrangement as illustrated in FIGS. 16 to 18, in which a diode on the drain side as illustrated in FIG. 15 is integrated in the semiconductor body, and in which the drain zone extends underneath the drift control zone.

FIG. 22 illustrates a cross section, running at right angles to the vertical direction, through a MOSFET according to the invention with a strip layout corresponding to the MOSFET illustrated in FIG. 21, on a plane E-E' that is illustrated there.

FIG. 23 illustrates a cross section, running at right angles to the vertical direction, through a MOSFET according to the invention with a cell arrangement having a rectangular cross section.

FIG. 24 illustrates a horizontal section, running at right angles to the vertical direction, through a MOSFET according to the invention with a cell arrangement having a circular cross section.

FIG. 25 illustrates a horizontal section, running at right angles to the vertical direction, through a MOSFET according to the invention with a drift zone with a meandering cross section.

FIG. 26 illustrates a cross section through a semiconductor component which is in the form of a Schottky diode and in which the drift control zones are designed to be monocrystalline and are electrically isolated on the cathode side from the heavily doped connecting zone of the diode region.

FIG. 27 illustrates a graph illustrating the profile of the diode current in the Schottky diode illustrated in FIG. 26, in which the drift control zones are connected on the cathode side with a high impedance to the heavily doped connecting zone, compared to the diode current through the same diode, but with a short circuit on the cathode side between the drift control zones and the cathode electrode, on a linear scale.

FIG. 28 illustrates the graph as illustrated in FIG. 27, but on a logarithmic scale.

FIG. 29 illustrates the electron distribution in the Schottky diode as illustrated in FIG. 26, when forward-biased.

FIG. 30 illustrates a Schottky diode with a drift control zone which is connected to the cathode electrode of the Schottky diode via a first connection zone which is lightly doped in a manner complementary to it.

FIG. 31 illustrates a Schottky diode as illustrated in FIG. 30, in which the first connection zone is formed from intrinsic semiconductor material rather than doped semiconductor material.

FIG. 32 illustrates a Schottky diode with a drift control zone which is connected directly to the heavily doped connecting zone via an intrinsic first connection zone.

FIG. 33 illustrates a Schottky diode, in which at least one of the drift control zones has a projection which extends as far as the heavily doped connecting zone, and makes contact with it.

FIG. 34 illustrates a Schottky diode with a drift control zone which is connected to the heavily doped connecting zone via a high-impedance resistance layer.

FIG. 35 illustrates a Schottky diode with a drift control zone which is isolated from the cathode electrode of the Schottky diode on the cathode side in places, and FIG. 36 illustrates a Schottky diode as illustrated in FIG. 26, in which the drift control zone is connected to the anode metal of the Schottky contact of the Schottky diode by means of a lightly p-doped connection layer.

FIG. 37 illustrates a Schottky diode in which the drift control zone is connected to the heavily doped connecting zone via a section of a connecting electrode.

FIG. 38 illustrates a Schottky diode in which the drift control zone is connected to a connecting electrode, which makes contact with the heavily doped connecting zone, via a tunnel dielectric.

FIG. 39 illustrates a Schottky diode which has been modified with respect to the Schottky diode illustrated in FIG. 13 and is in the form of a "merged" pin-Schottky diode.

FIG. 40 illustrates a Schottky diode which has been modified with respect to the Schottky diode illustrated in FIG. 38, in which a monocrystalline semiconductor layer is arranged between the tunnel dielectric and the connecting electrode.

FIG. 45 illustrates a component which has been modified with respect to the component illustrated in FIG. 41, in which the gate electrode and the drift control zone are isolated from one another, and in which the drift control zone can be connected to a control potential.

FIG. 46 illustrates a method for production of a semiconductor component in the form of a MOSFET, in which the drift control zone is connected directly to the gate electrode, during individual method steps.

FIG. 49 illustrates a semiconductor component in the form of a MOSFET with a drift control zone connected directly to the gate electrode, and with a multilayer accumulation dielectric.

FIG. 50 illustrates a component which has been modified with respect to the component illustrated in FIG. 49, with a multilayer accumulation dielectric.

DETAILED DESCRIPTION OF THE DRAWINGS

Unless stated to the contrary, identical reference symbols in the figures denote identical component areas with the same meaning.

Figure 1:
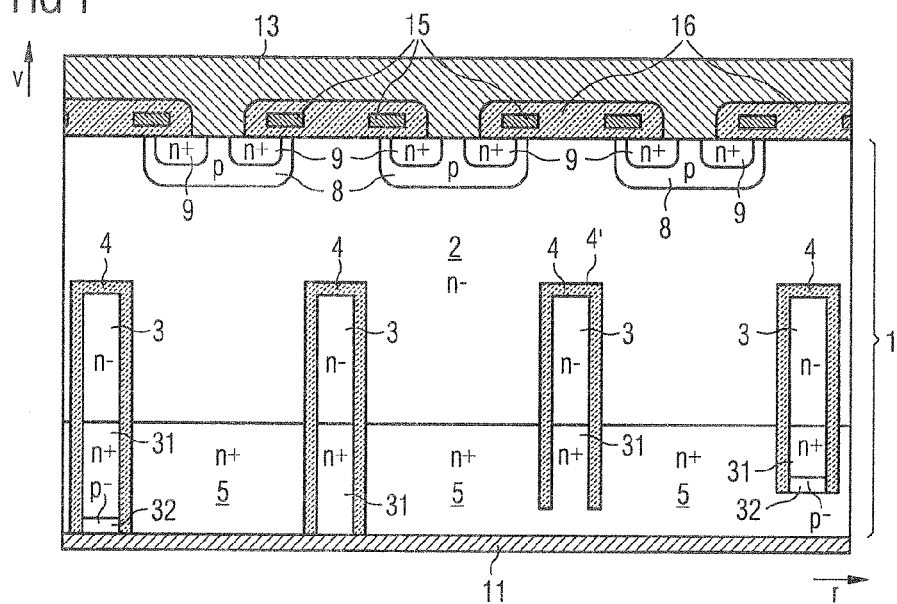
FIG. 1 illustrates a section of a semiconductor component according to the invention, which is in the form of a planar MOSFET and has a semiconductor body with a plurality of MOSFET cells and a plurality of drift control zones arranged in the drift zone, and with a dielectric being arranged between the drift zone and the drift control zones.

FIG. 1 illustrates a cross section through a section of a power semiconductor component according to the invention. The illustrated component is in the form of a planar MOSFET and has a semiconductor body 1 in which a drift zone 2 and a connecting zone 5, which is more heavily doped than the drift zone 2 but is of the same conductivity type as the drift zone 2, are arranged. The illustrated MOSFET is n-conductive, while the drift zone 2 and the connecting zone 5 which forms the drain zone of the MOSFET are in this case n-doped. In the case of a p-conductive MOSFET (not illustrated), these zones 2, 5 are p-doped zones, in a corresponding manner.

The MOSFET illustrated in FIG. 1 is in the form of a vertical MOSFET, whose drain zone 5 is arranged in the area of a rear face of the semiconductor body 1. In this component, source zones 9 are arranged in the area of a front face of the semiconductor body 1 and are separated from the drift zone 2 by body zones 8 doped in a complementary manner to the source zones 9. In the case of an n-conductive MOSFET, the source zones are n-doped, and the body zones are p-doped. In the case of a p-conductive MOSFET (not illustrated), these zones are doped in a corresponding complementary manner.

A drain electrode 11 is arranged on the drain side or rear face, and a source electrode 13 is arranged on the source side or front face, of the semiconductor body 1. The drain electrode 11 makes contact with the heavily doped connecting zone 5, and the source electrode 13 makes contact with the source zones 9 and the body zones 8.

The component illustrated in FIG. 1 is designed to be cellular and has a number of identical transistor cells which each have a source zone and a body zone 9, 8. A gate electrode 15 is provided in order to control a conductive channel in the body zone between the source zones 9 and the drift zone 2, and is isolated from the semiconductor body 1 by a dielectric layer 16.

At least one drift control zone 3 is formed in the component in places adjacent to the drift zone 2, with a plurality of such drift control zones 3 being provided in the illustrated component, and being arranged at a distance from one another in a lateral direction r of the semiconductor body 1. A dielectric layer 4 is arranged between each of these drift control zones 3 and the drift zone 2.

The drift control zones 3 are coupled to one of the load connection potentials of the MOSFET and are connected to the drain 5 and/or source 9 during operation. In the example, the drift control zones 3 are connected to the drain zone 5 for this purpose. The drift control zones may be connected to this drain zone 5 in a different manner. Four different options relating to this are illustrated in FIG. 1. On the one hand, the drift control zone 3 can be connected to the drain electrode 11 via a heavily doped first connecting zone 31 of the same conductivity type as the drift control zone. In this case, the dielectric layer 4 extends as far as the drain electrode 11 and thus provides dielectric isolation between the first connecting zone 31 and the drain zone 5.

A second connecting zone 32, which is doped in a complementary manner to the first connecting zone, can optionally be arranged between the heavily doped first connecting zone 31 and the drain electrode 11, with the second connecting zone 32 being more lightly doped than the first connecting zone 31.

It is also possible for the drain zone 5 to extend underneath the drift control zone 3 and/or the first connecting zone 31 which is connected to the drift control zone 3. In this case as well, a complementary-doped second connecting zone 32 can optionally also be provided, and is then arranged between the first connecting zone 31 and that section of the drain zone 5 which extends underneath the drift control zone 3.

Each individual one of the drift control zones 3 is composed of a semiconductor material, which is preferably monocrystalline. Each of the drift control zones 3 is doped in such a manner that the quotient of the net dopant charge arranged in one area of the drift control zone 3, which is adjacent to the drift zone 2, divided by the area of the dielectric layer 4 adjacent to this area is less than the breakdown charge of the semiconductor material in the drift control zone. Only that area of the section of the dielectric layer which is located between the drift control zone 3 and the drift zone 4 is used for determination of this quotient in this case, that is to say to which the drift zone 2 is connected directly on one side and the drift control zone 3 is connected directly on the other side. This section of the dielectric layer 4 which is located directly between the drift zone 2 and the drift control zone 3 is referred to in the following text as the accumulation dielectric. For determination of this quotient, that volume of the drift control zone 3 which is arranged in a direction at right angles to the accumulation dielectric 4 is considered, that is to say that which results in a direction at right angles to the accumulation dielectric 4, starting from the accumulation dielectric 4, by the formation of the volume integral over the drift control zone 3.

For explanatory purposes, one of the drift control zones illustrated in FIG. 1 will be considered in the following text, with these drift control zones being bounded on two sides and at the top by the dielectric layer 4. For explanatory purposes, the following text also considers the special case in which the drift control zones 3 are each homogeneously doped, and in which the area of the section of the dielectric layer which bounds the drift control zone at the top is small in comparison to the "side surfaces", which separates the drift control zone 3 from the drift zone 2 on the left and right in FIG. 1. For this special case, the doping rule stated above is thus equivalent to saying that the integral of the ionized dopant concentration in the drift control zone 3 in the direction r at right angles to the dielectric layer 4 and considered over the entire "width" of the dopant zone is less than twice the value of the breakdown charge of the semiconductor material in the drift control zone 3. If the semiconductor material is silicon, this breakdown charge is about $1.2 \cdot 10^{12}$ e/cm$^2$, where e denotes the elementary charge.

If a drift control zone which is homogeneously doped but is not illustrated in any more detail is considered, to which a drift zone is connected on only one side and is separated from the drift control zone by a dielectric layer, then it can be the for this drift control zone that the integral of the dopant concentration in the direction at right angles to the dielectric layer is less than the breakdown charge.

The doping rule explained above for the drift control zone 3 is based on the idea of doping the drift control zone sufficiently lightly that no electric field which reaches the breakdown field strength of the semiconductor material in the drift control zone 3 can build up in the drift control zone 3 in the direction of the dielectric layer 4, irrespective of any electrical potential present in the drift zone 2.

The drift control zones 3 are preferably composed of the same semiconductor material as the drift zone 2 and have the same doping concentration, with their dimensions being chosen, in particular in the lateral direction r, such that the condition stated above is satisfied for the net dopant charge with respect to the surface of the dielectric 4.

In order to achieve a good accumulation effect of charge carriers in the drift zone 2, it is advantageous to make the dielectric 4 very thin, so that the electric field in the drift control zone 3 can pass through to the drift zone 2 as well as possible. The minimum thickness of the dielectric 4 is in this case governed by the potential difference applied between the drift control zone 3 and the drift zone 2 and the maximum long-term field-strength load on the insulator. With typical long-term potential differences of considerably less than about 100 V, preferably of 5 V to 20 V between the drift control zone and the drift zone, and the use of thermal silicon dioxide as the dielectric result in typical thicknesses of less than about 500 nm, preferably from about 25 nm to about 150 nm.

The dielectric 4, which preferably separates the drift control zone 3 completely from the drift zone 2, thus forms a completely closed surface between the drift control zone 3 and the drift zone 2. In this case, in particular, it is possible for the dielectric to be in the form of a tunnel dielectric in places, in particular a tunnel oxide, as is illustrated for one of the drift control zones 3 in FIG. 1, in which the dielectric above the drift control zone 3 is in the form of a tunnel dielectric 4'. The function of this tunnel dielectric will also be explained in the following text.

The drift control zone 3 preferably has the same doping profile in the vertical direction v as that section of the drift zone 2 which extends in the vertical direction v over the same area as the drift control zone 3.

In the example illustrated in FIG. 1, the drift control zones are matched to the pattern of the cell array which is arranged in the area of the front face, with the drift control zones 3 each being arranged between two adjacent body zones 8 in the lateral direction of the semiconductor body 1. However, such matching to the pattern of the cell array is not essential. In particular, it is possible to choose a different pattern for the drift control zones 3 than for the cell array, and in particular the drift control zones 3 can also be arranged under the body zones 8.

Figure 2:
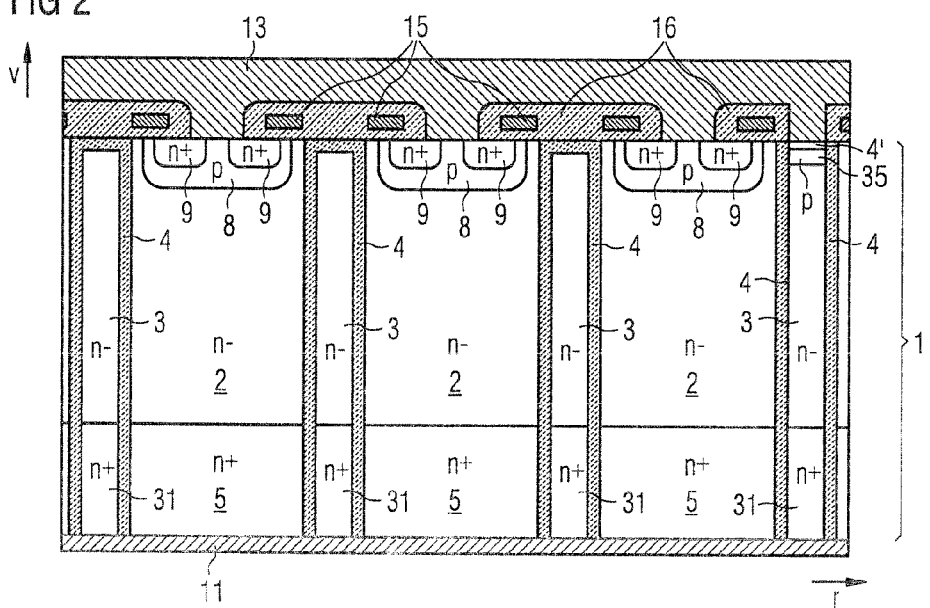
FIG. 2 illustrates a cross section through a section of planar MOSFET with a plurality of drift control zones, in which the dielectric extends in the vertical direction between two mutually opposite sides of the semiconductor body.

FIG. 2 illustrates a further exemplary embodiment of a component according to the invention in the form of a MOSFET. This exemplary embodiment differs from the exemplary embodiment illustrated in FIG. 1 in that the drift control zones 3 extend to the front face of the semiconductor body 1, with the drift control zones 3 likewise being covered by the dielectric layer 4 and the tunnel dielectric 4' in the area of the front face.

Figure 3:
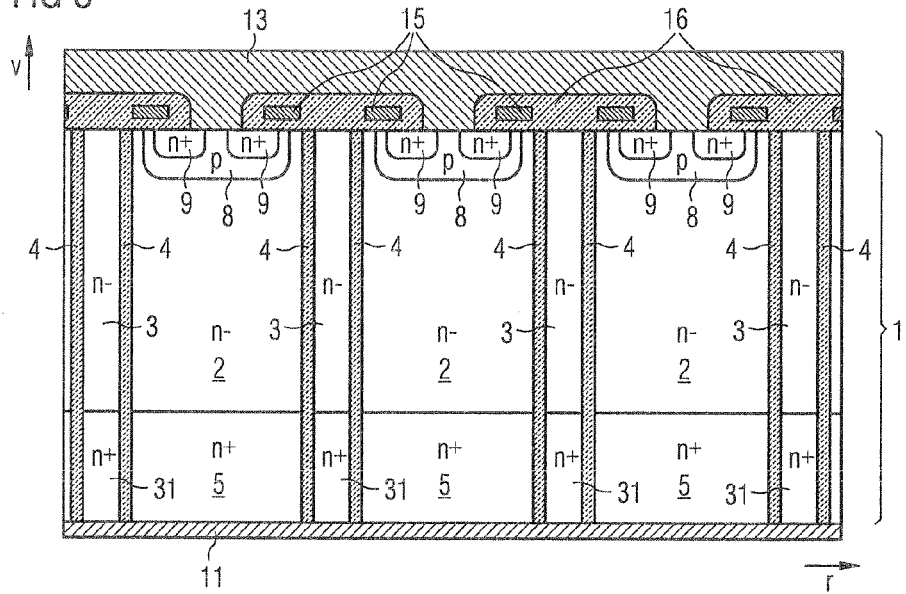
FIG. 3 illustrates a cross section through a section of a planar MOSFET whose drift control zones extend as far as the source-side surface of the semiconductor body.

In the exemplary embodiment illustrated in FIG. 3, the dielectric layer 4 on the front face has been dispensed with, which is possible when the front face of the semiconductor body 1 is covered in a preferred manner by the dielectric, which surrounds the gate electrodes, in the area of the drift control zone. The drift control zone 3 is thus electrically isolated from the gate electrodes 15 and from the source electrode 13 in the area of the front face of the semiconductor body 1 (source side).

Alternatively, in the case of the components in FIGS. 2 and 3, in which the drift control zones 3 extend to the front face of the semiconductor body, it is also possible to connect the drift control zone 3 to the source electrode 13 via a tunnel dielectric 4' and a connecting zone 35 with complementary doping to the drift control zone 3, as is illustrated for the drift control zone 3 that is illustrated on the extreme right in FIG. 2.

Figure 4:
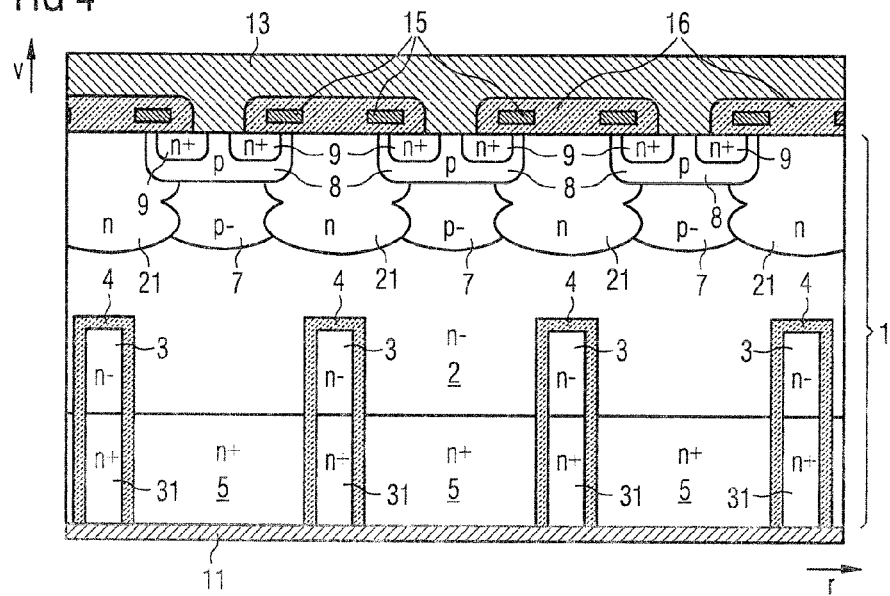
FIG. 4 illustrates a cross section through a section of a MOSFET according to the invention with compensation zones which are adjacent to the body zones and between which intermediate zones with complementary doping to the body zones are arranged, with the drift control zones being arranged on the drain side of the intermediate zones.

With reference to FIG. 4, compensation zones 7 can be provided in the drift zone 2 of the MOSFET and have the same conductivity type as the body zones 8, but are more lightly doped than them. The compensation zones 7 preferably each make contact with one of the body zones 8.

According to the exemplary embodiment illustrated in FIG. 4, intermediate zones 21 which are more heavily doped than other areas of the drift zone 2 and whose doping is complementary to that of the compensation zones 7 are arranged in the drift zone 2 between adjacent body and compensation zones 8, 7.

In the exemplary embodiment illustrated in FIG. 4, the drift control zones 3 are each arranged between the intermediates zones 21 and the drain electrode 11 in the lateral direction. In this exemplary embodiment, the drift control zones 3 which are surrounded by the dielectric 4 in the semiconductor body end at a distance from the intermediate zones 21 in the vertical direction.

Figure 5:
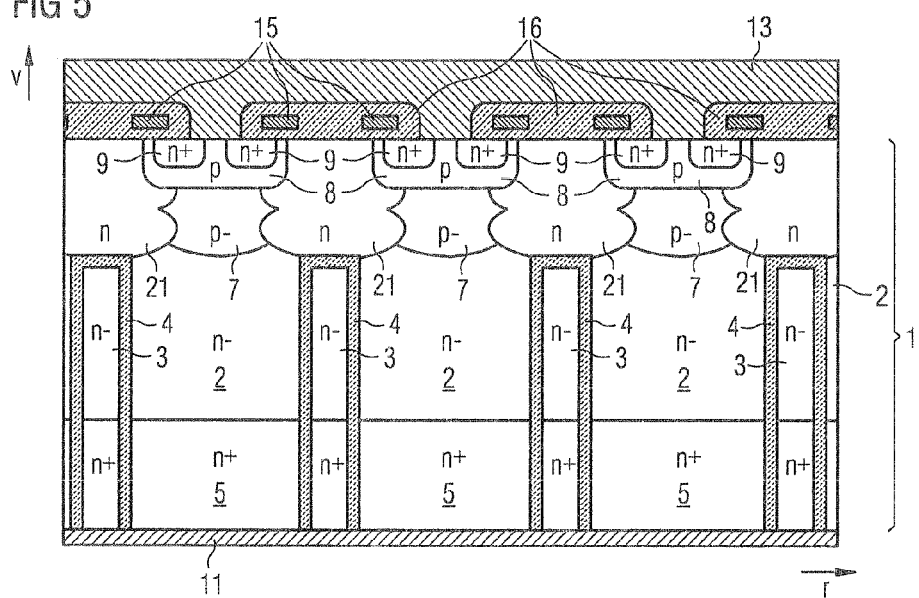
FIG. 5 illustrates a MOSFET as illustrated in FIG. 4, in which the dielectric which surrounds the drift control zones extends as far as the intermediate zones.

With reference to FIG. 5, the drift control zones 3 together with the dielectric 4 surrounding them may also extend as far as the intermediate zones 21, or may extend into the intermediate zones 21. The drift control zones 3 may in this case also extend as far as the front face of the semiconductor body (not illustrated).

Figure 6:
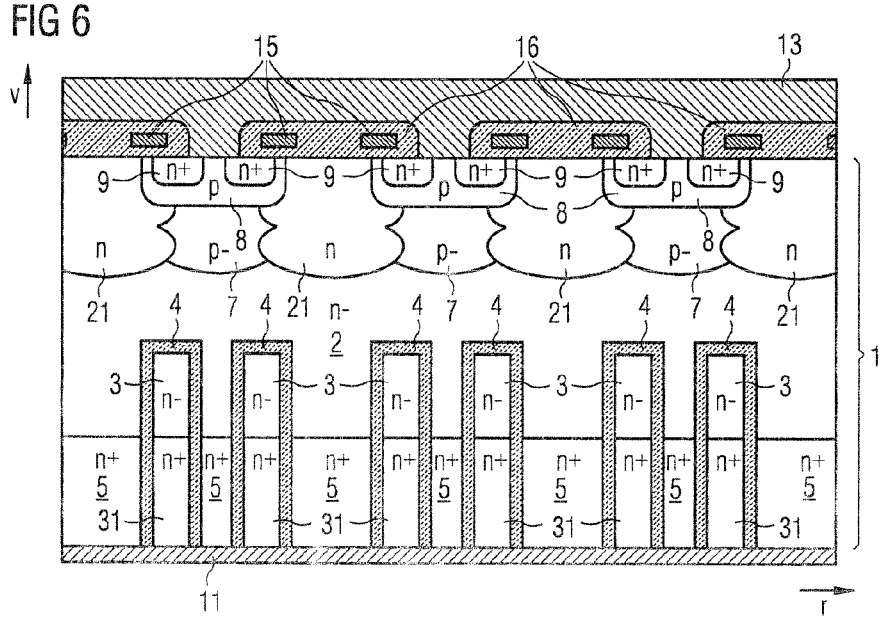
FIG. 6 illustrates a cross section through a section of a MOSFET which has a plurality of compensation zones and a plurality of drift control zones, which are spaced apart from one another in the lateral direction and are closer together in the area underneath the compensation zones than in the other areas of the semiconductor body.

A further exemplary embodiment of a MOSFET with drift control zones 3 is illustrated in FIG. 6. In this case, a plurality of drift control zones 3 which are coupled to the drain zone are arranged non-uniformly in the lateral direction in the semiconductor body 1. In this case, the distance between adjacent drift control zones 3 in the area of the compensation zone 7 is chosen to be less than in other areas.

Figure 7:
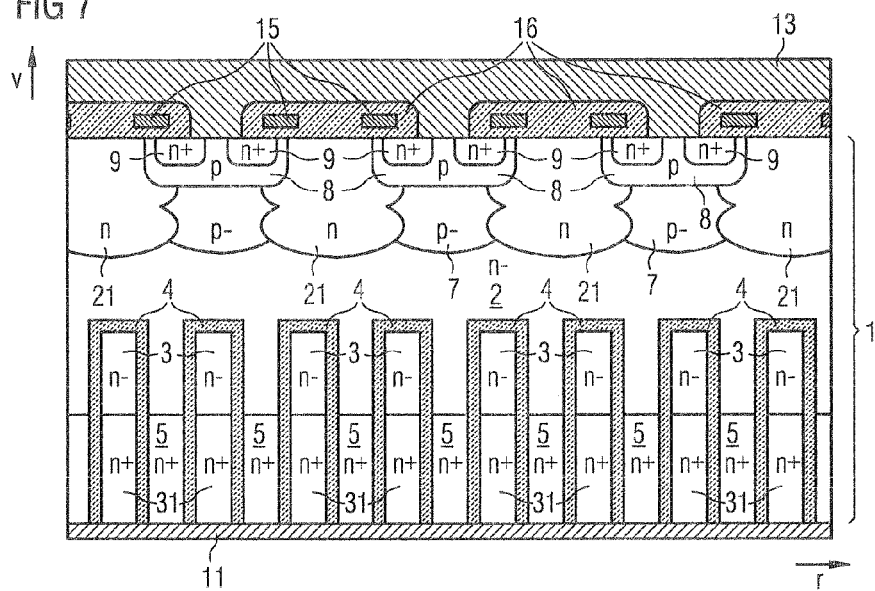
FIG. 7 illustrates a cross section through a section of a MOSFET with a number of drift control zones which are spaced apart from one another at equal intervals in the lateral direction.

With reference to FIG. 7, the drift control zones 3 may be spaced apart from one another at equal intervals in the lateral direction of the semiconductor body 1.

The exemplary embodiments in FIGS. 1 to 7 illustrate planar MOSFETs. The concept of the present invention, to provide a drift control zone 3 which is composed of a semiconductor material and is isolated from a drift zone 2 by a dielectric 4 and whose net dopant charge with respect to the surface of the dielectric 4 is less than the breakdown charge may, of course, also be applied to trench MOSFETs with a vertical gate electrode arranged in a trench.

Figure 8:
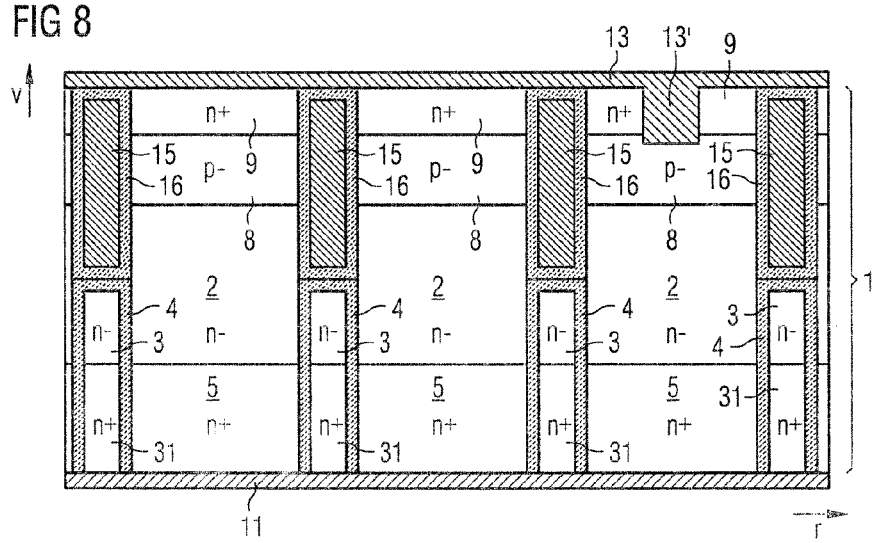
FIG. 8 illustrates a cross section through a section of a semiconductor component according to the invention, which is in the form of a trench MOSFET with a plurality of gate electrodes arranged in trenches in the semiconductor body, and with drift control zones which are arranged underneath the gate electrodes.

FIG. 8 illustrates a trench MOSFET such as this with a plurality of drift control zones 3. In the case of this component, the source zone 9, the body zone 8 with complementary doping to the source zone, the drift zone 2 and the heavily n-doped connecting zone or drain zone 5 are arranged such that they follow one another directly starting from the source electrode 13, to the drain electrode 11.

The trench MOSFET has electrically conductive gate electrodes 15 which, for example, are composed of a metal or of a heavily doped polycrystalline semiconductor material such as polysilicon, which is electrically isolated from the other areas of the semiconductor body 1 and from the source electrode 13 by means of gate isolation 16, for example composed of semiconductor oxide.

The gate electrode 15 is arranged in trenches which extend through the source zones 9 and body zones 8 into the drift zone.

The source electrode 13 is preferably designed in such a manner that it short-circuits the source zone 9 and the body zone 8 in order in this way to eliminate a parasitic bipolar transistor, which is formed by the source zone 8, the body zone 9 and the drift zone 2, in a known manner. In the example, the source electrode 13 for this purpose has an electrode section 13', which extends in the vertical direction through the source zone 9 into the body zone 8, as is illustrated for the transistor cells in the right-hand part of FIG. 8.

As in the case of the previous exemplary embodiments, the drift control zone 3 is connected to the drain electrode 11 and thus to the drain zone 5 by means of a heavily n-doped first connection zone 31.

Figure 9:
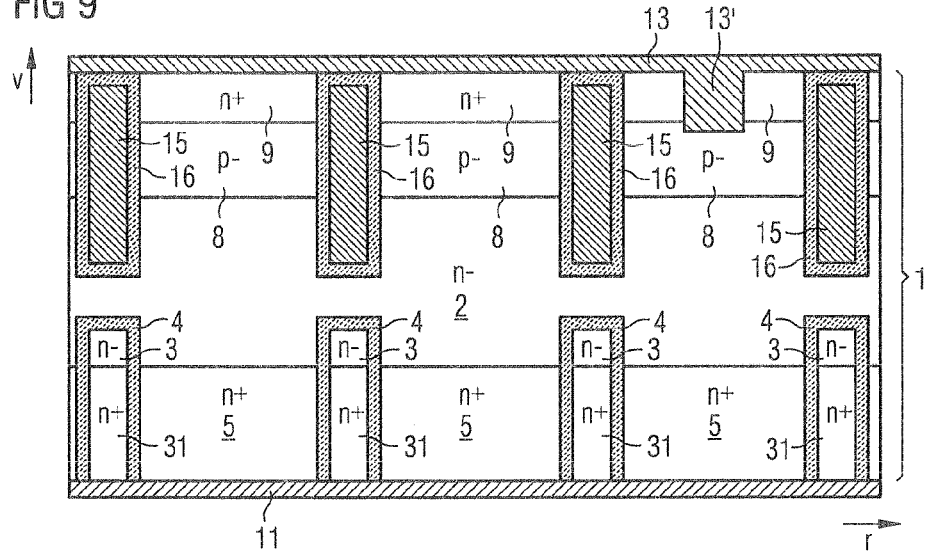
FIG. 9 illustrates a cross section through a section of a trench MOSFET as illustrated in FIG. 8, in which the drift control zones as well as the dielectric which is arranged between the drift control zones and the drift zones are separated by gate insulation arranged between the gate electrodes and the drift zone.

In this case, the drift control zones 3 are each arranged directly underneath the trenches with the gate electrodes 15, and are isolated from the drift zone 2 by the dielectric 4. The drift control zones 3 together with the dielectric 4 in this case extend as far as the trenches with the gate electrodes. With reference to FIG. 9, the drift control zones 3 together with the dielectric 4 may, however, also end at a distance from the trenches with the gate electrodes 15.

While in the case of the exemplary embodiments illustrated in FIGS. 8 and 9 the drift control zones 3 are each arranged between a gate electrode 15 and the drain electrode 11, further drift control zones can alternatively or additionally be provided which are arranged in the lateral direction between adjacent gate electrodes 15.

Figure 10:
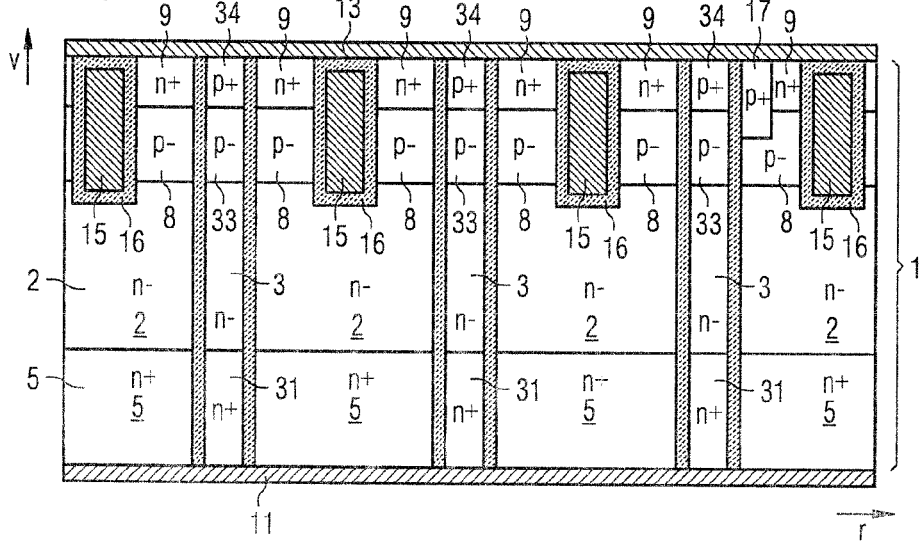
FIG. 10 illustrates a cross section through a section of a trench MOSFET with a plurality of drift control zones, which are arranged between each of the gate electrodes in the lateral direction, and with the drift control zones and a dielectric which is arranged between the drift control zones and the drift zone extending between mutually opposite sides of the semiconductor body in the vertical direction.

In the last-mentioned case, the dielectric 4 may extend from the drain-side surface of the semiconductor body 1 to its source-side surface, preferably continuously. FIG. 10 illustrates one exemplary embodiment of this. In contrast to the previous embodiments, a lightly p-doped third connection zone 33 as well as a heavily p-doped fourth connection zone 34 are also connected successively to the drift control zone 3 on the source side. The fourth connection zone 34 makes contact with the source electrode 13, or is at least electrically conductively connected to it.

According to one preferred embodiment of the invention, the drift control zones 3 extend over the same area as the drift zone 2 in the vertical direction v. According to a further preferred embodiment, the third connection zone 33 extends over the same area as the body zone 8 in the vertical direction v.

As in the case of the previous exemplary embodiments, the drift control zone 3 is connected to the drain electrode 11 and thus to the drain zone 5 by means of a heavily n-doped first connection zone 31. In this context, it should be noted that the various options explained with reference to FIG. 1 for electrical connection of the drift control zone 3 to the drain zone 5 can also be applied to the component illustrated in FIG. 10, to the component in the already explained FIGS. 2 to 9 and to the component illustrated in FIG. 11, which will be explained in the following text.

A heavily p-doped semiconductor zone 17 is preferably arranged adjacent to the dielectric 4 in the body zone 9 and in places in the source zone 8, as is illustrated for one of the transistor cells in the right-hand part of FIG. 10. This zone 17, which is referred to in the following text as a bypass zone, forms a very low-impedance bypass for holes to the source zone 9, and thus prevents early latching of the cell, in particular in the avalanche and commutation of the power semiconductor component operating situations. This zone 17 also prevents a channel which can be controlled by the drift control zone 3 being produced between the source zone 9 and the drift zone 2.

FIG. 11 illustrates one possible way to reduce the sensitivity of the semiconductor body 1 to mechanical stresses which can occur as a result of the production of the drift control zones 3 with the dielectric 4 surrounding them. For this purpose, the dielectric 4 is formed from dielectric layer elements 4a, 4b, between which an intermediate space 4c is located and is filled with a compressible medium such as a gas, for example air.

According to one preferred embodiment of the invention, the layer elements 4a, 4b of the dielectric 4 may rest on one another on the source side, or may preferably be formed integrally with one another. Furthermore, webs are provided between the layer elements 4a, 4b for robustness, and are preferably composed of the same material as the layer elements 4a, 4b.

The already explained components are switched on by application of a suitable drive potential to the gate electrode 15 and by application of a positive voltage between the drain zone 5 and the source zone 9, or between the drain electrode 11 and the source electrode 13. The electrical potential on the drift control zones 3 in this case follows the electrical potential on the drain zone 5, in which case the potential on the drift control zone 3 may be less by the value of the on-state voltage of a pn junction than the potential on the drain zone 5 when the drift control zone 3 is connected to the drain zone 5 via a pn junction (32, 31 in FIG. 1). The electrical potential in the drift zone 2 decreases in the direction of the body zone 8 as a result of the unavoidable electrical resistance of the drift zone 2. In consequence, the drift control zone 3 is at a higher potential than the drift zone 2, with this potential difference increasing as the distance from the drain zone 5 increases in the direction of the body zone 8. This potential difference results in an accumulation zone being created adjacent to the dielectric in the drift zone 2, in which charge carriers, in the present case electrons, are accumulated. This accumulation zone results in a reduction in the on-state resistance of the component in comparison to conventional components.

The components block when no suitable drive potential is applied to the gate electrode 15 and when a positive drain-source voltage is applied. The pn junction between the drift zone 2 and the body zone 8 is thus reverse-biased, so that a space charge zone is formed in the drift zone 2, starting from this pn junction, in the direction of the drain zone. The reverse voltage that is applied is in this case dissipated in the drift zone 2, that is to say the voltage which is applied across the drift zone 2 corresponds to the applied reverse voltage.

When blocked, this space charge zone is likewise formed in the vertical direction in the drift control zone 3, and results from the fact that the voltage drop across the dielectric 4 is limited to an upper maximum value by the light doping of the drift control zone 3. The dielectric 4 together with the drift control zone 3 and the drift zone 2 forms a capacitance, whose capacitance C' is given by:

$$C' = \epsilon_0 \epsilon_r / d_{accu} \quad (1)$$

$\epsilon_0$ in this case denotes the dielectric constant for the vacuum, and $\epsilon_r$ denotes the relative dielectric constant of the dielectric that is used, and which is about 4 for silicon dioxide ($SiO_2$).

The voltage across the dielectric is dependent in a known manner on the stored charge in accordance with:

$$U = Q'/C' \quad (2)$$

where Q' denotes the stored charge with respect to the surface of the dielectric.

In the blocking state, the voltage U which is applied across the dielectric 4 is limited by the net dopant charge of the drift control zone 3. On the assumption that the net dopant charge of the drift control zone 3 related to the surface of the dielectric is less than the breakdown charge $Q_{Br}$, the voltage U which is applied across the dielectric 4 is given by:

$$U = \frac{Q'}{C'} \leq \frac{Q_{Br} \cdot e}{\varepsilon_0 \varepsilon_r} \cdot d_{accu} \quad (3)$$

The maximum voltage applied across the accumulation dielectric 4 thus rises linearly with its thickness $d_{accu}$ and thus, at a first approximation, approximately the same extent as its withstand voltage. For $SiO_2$ with $\epsilon_r$ of about 4 and a thickness of 100 nm, this results in a maximum voltage load U of 6.8 V, which is considerably less than the maximum permissible long-term load on an oxide such as this of about 20 V. The breakdown charge is in this case about $1.2 \cdot 10^{12}/cm^2$.

In the blocking state, a space charge zone is thus formed in the drift control zone 3, whose potential profile may differ from the potential profile of the drift zone 2 by at most the value of the voltage which is applied across the dielectric 4 and is limited by the light doping of the drift control zone. The voltage across the oxide is in this case always less than its breakdown voltage.

In the case of the components which have been explained above with reference to FIGS. 1 to 9 and 11, the drift control zones 3 are connected exclusively to the drain zone 5. When the component is in the off state, holes which cannot flow away can be accumulated in the drift control zones 3 because of thermal generation of electron-hole pairs. Over time, this amount of charge can rise to such an extent that the maximum permissible field strength of the dielectric is reached, and the dielectric 4 breaks down. With reference to FIG. 1, this can be avoided by the dielectric layer 4 being in the form of a tunnel dielectric 4' in places, thus allowing the accumulated charge carriers to flow away into the drift zone 2 as soon as the breakdown field strength of the tunnel dielectric 4' is reached, and even before the breakdown field strength of the rest of the dielectric is reached, 4.

By way of example, layers composed of silicon oxide ($SiO_2$) or silicon nitride ($Si_3N_4$) or else multiple layers composed of silicon oxide and silicon nitride are suitable for use as tunnel dielectrics. Mixed dielectrics composed of silicon, oxygen and nitrogen are likewise possible. Typical tunnel field strengths are in the range from 1 . . . 2 V/nm. For a tunnel oxide 4' with a thickness of 13 nm, this therefore results in maximum voltages of 13 . . . 26 V, which is greater than the voltage applied to the dielectric 4 during normal blocking operation and which a dielectric 4 composed of silicon oxide and having a thickness of for example 100 nm will withstand without any problems.

In the exemplary embodiment illustrated in FIG. 1, the tunnel dielectric is arranged at the upper end of the drift control zone 3. It is particularly advantageous for the accumulated holes to assist the process of switching the component on, because they assist the production of an accumulation zone in the drift zone 2 until the difference between the potential on the drift zone 2 and on the drain zone 5 has fallen below the value of the tunnel voltage. After this, excess holes flow away out of the drift control zone 3 in the direction of the drain zone 5 and drain electrode 11.

The tunnel dielectric 4' in FIG. 2, which is arranged between the drift control zone 3 and the source electrode 13, is likewise used to dissipate the leakage current produced by thermal charge carrier generation. The pn junction absorbs a reverse voltage which is applied between the drift control zone 3 and the source electrode. The tunnel dielectric could also be connected to the source zone 9, in a manner which is not illustrated in any more detail.

FIG. 12 illustrates a detail of a further exemplary embodiment of a component according to the invention in the form of a trench MOSFET. The component has a component structure of a conventional vertical trench MOSFET 20 with a source zone 9, a body zone 8, a drift zone 2 and a drain zone 5, as well as a gate electrode 15, which is arranged in a trench. In this case, a source electrode 13 makes contact with the source zone 9, and a drain electrode 11 makes contact with the drain zone 5.

The p-doped body zone 8 is connected to the source electrode 13 in this case via the heavily p-doped bypass zone 17, with the source electrode 13 forming a very low-impedance bypass for holes to the source zone 9, and thus preventing early latching of the cell, in particular in the power semiconductor component avalanche and commutation operating situations. This zone 17 also prevents a channel which can be controlled by the drift control zone 3 being produced between the source zone 9 and the drift zone 2.

A drift control zone 3 is arranged adjacent to the drift zone 2 and is connected to the rear-face drain electrode 11 by means of a heavily n-doped first connection zone 31. In this component, the drift control zone 3 extends in the vertical direction approximately as far as the front face of the semiconductor body 1, and is thus also arranged adjacent to the body zone 8 in places. In the direction of the front face, the drift control zone 3 is followed by a heavily n-doped third connection zone 33, which makes contact with a fourth electrode 19 that is arranged on the semiconductor body 1. The fourth electrode 19 is at a distance from the source electrode 13, and is electrically isolated from it.

The drift control zone 3 together with the first connection zone 31 and the third connection zone 33 forms a junction field-effect transistor (JFET), whose gate represents the body zone 8 or bypass zone 17. This junction field-effect transistor 31, 3, 33 can be switched off by a sufficiently high negative potential on the body zone 8. In the case of conventional n-channel JFETs, there is no dielectric between the p-doped gate and the n-doped channel region. The dielectric 4 which is provided here does not impede the cut-off effect, however.

The dopant concentration in the drift control zone 3 may be very low and may, for example, be about $10^{14}$ cm$^{-3}$. The junction field-effect transistor 31, 3, 33 is in consequence cut off even when the voltage difference between the body zone 8 and the drift control zone 3 is a few volts.

A first diode 41 with an anode 41a and a cathode 41b is connected to the MOSFET, with the anode 41a being connected to the source zone 9 via the source electrode 13, and the cathode 41b being connected to the junction field-effect transistor 31, 3, 33 via the fourth electrode 19.

Since the junction field-effect transistor 31, 3, 33 is switched off when the MOSFET is in the off state, and no current can flow out of it, it is irrelevant if the first diode 41 has a high leakage current.

Instead of providing the first diode 41 as an external component, it can also advantageously be integrated in the semiconductor body, as a diode monolithically or as a polysilicon diode. Furthermore, a high-impedance resistance or a transistor can also be used instead of the first diode 41.

It should be noted that FIG. 12 illustrates only one section of the entire component. First of all, a further section of the dielectric 4 is adjacent to this section on the left-hand side, followed by a further trench MOSFET structure (not illustrated). The illustrated MOSFET structure and the further MOSFET structure are designed with mirror-image symmetry with respect to one another, with respect to a plane of symmetry which runs in the vertical direction v and at right angles through the plane of the illustration.

One method of operation of the component will be explained in the following text:

The component is in the on state when a positive operating voltage is applied between the drain electrode 11 and the source electrode 13, and when a suitable drive potential is applied to the gate electrode 15. The voltage drop between the drain and the source when the component is in the on state is less than the blocking voltage of the diode 41, as a result of which the diode 41 is reverse-biased, and the potential on the drift control zone 3 corresponds approximately to the drain potential. This operating voltage is dropped across the drift path 2 in the area of the MOSFET structure, so that the potential in the drift path decreases as the distance to the drain zone 5 increases, as a result of which the voltage between the drift control zone 3 and the drift zone 2 increases to the same extent as the distance to the drain zone 5 increases. The potential on the drift control zone 3, which is positive with respect to the potential on the drift zone 2, ensures that charge carriers are accumulated along the dielectric 4 in the drift zone 2, with these charge carriers being electrons in the example, thus leading to a reduction in the on-state resistance of the component.

If the component is switched off by suitably driving the gate electrode, then a space charge zone propagates in the drift zone 2 starting from the pn junction, and the voltage across the drift path 2 rises. The potential on the drift control zone in this case first of all follows the potential on the drain zone 5 or drain electrode, because the diode 41 is reverse-biased. As the potential on the drift control zone 3 rises, the junction FET which is formed by the drift control zone 3, the dielectric 4 and the body zone 4 is cut off increasingly until it is switched off completely and the potential in this area adjacent to the body zone remains at a value which differs from the potential on the body zone 8 by the value of the blocking voltage of the junction FET. The junction FET which is formed in the upper area of the drift control zone in this case protects the diode 41 against excessively high voltages when the drain potential rises further. The voltage for cutting off the junction FET completely is in this case set such that it is lower than the breakdown voltage of the diode 41.

When the drain potential rises further, the voltage drop across the drift control zone increases in the lower area, that is to say in the area between the heavily doped connecting zone 31 and the body zone 8, corresponding to the voltage drop across the drift zone 2. The maximum voltage which is applied between the drift control zone 3 and the drift zone 2 is thus limited. This maximum voltage is approximately in the region of the switching-off voltage of the junction FET, and is normally a few volts, so that the dielectric 4 is not subject to a high voltage load and can be designed to be correspondingly thin. A thin dielectric 4 is once again advantageous in terms of the accumulation of charge carriers in the drift zone 2 when the component is switched on, with the accumulation response becoming better the thinner the dielectric 4 for a given potential difference between the drift control zone 3 and the drift zone 2.

The advantage of the arrangement illustrated in FIG. 12 is that a current path is provided via the diode 41 between the connecting electrodes or drain and source electrodes 11, 13 of the component, via which charge carriers which are generated thermally in the drift control zone can flow away, so that this does not lead to the undesirable accumulation of charge carriers, as already explained, in the drift control zone and on the dielectric 4 in the off state.

FIGS. 13 and 14 compare the electron distribution of a conventional MOSFET and of the MOSFET illustrated in FIG. 12 in the on state, in each case with a gate voltage of 10 V and in each case likewise with a drain-source voltage of 10 V. FIG. 13 illustrates the electron distribution in the conventional MOSFET, while FIG. 14 illustrates the electron distribution in the MOSFET illustrated in FIG. 12.

The values illustrated on the graphs indicate the electron concentration in electrons per cm$^3$ for the respective areas.

In this case, in the case of the components according to the invention illustrated in FIG. 14, it can be seen that a region with an increased electron concentration is formed over virtually the entire length of the area of the drift zone 2 which is adjacent to the dielectric 4, with this concentration being at least two orders of magnitude greater than the electron concentration in the drift zone of a corresponding conventional component as illustrated in FIG. 13. This increased electron concentration is due to the potential on the drift control zone adjacent to the areas of the drift zones 2, in which the electron concentration is increased, and which is higher than the potential in the drift zone.

FIG. 15 illustrates a characteristic 59 which indicates the profile of the drain-source current $I_{DS}$ of a MOSFET according to the prior art in comparison to the corresponding characteristic 58 of a MOSFET according to the invention as illustrated in FIG. 12, as a function of the drain-source voltage $U_{DS}$.

As can be seen in this case, the load current $I_{DS}$ of the MOSFET according to the invention with a drain-source voltage of 4 V is greater by a factor of 4, while it is greater by a factor of 7 with a drain-source voltage of 10 V, than the drain-source current $I_{DS}$ in a MOSFET according to the prior art, although the cross-sectional area which is available for the current flow in the MOSFET according to the invention is considerably reduced in comparison to the cross-sectional area of a MOSFET according to the prior art, as a consequence of the space that is required for the drift control zone.

FIG. 16 illustrates a trench MOSFET which differs from the MOSFET illustrated in FIG. 12 in that the drift control zone 3 is electrically connected to the fourth electrode 19 via a lightly p-doped third connection zone 33 and a heavily p-doped fourth connection zone 34. The two-stage configuration of the p-doped connection zone with a relatively heavily doped zone 34 and a relatively lightly doped zone 33 is in this case optional.

In the on state, this component operates in a corresponding manner to the component that has already been explained with reference to FIG. 12, with the pn junction which is formed between the drift control zone 3 and the p-doped zones 33, 34 in the component illustrated in FIG. 16 ensuring on its own that the potential on the drift control zone can rise above the source potential, that is to say the potential on the source electrode 13.

It is assumed in the following text that the MOSFET is in the off state, in which a voltage of a few 10 V or even a few 100 V is applied between the drain electrode and the source electrode 11, 13 and across the drift path 2 of the MOSFET structure, and that the source electrode 13 is at a reference-ground potential, for example 0 V. The potential on the fourth electrode 19 then corresponds at most approximately to the value of the breakdown voltage of the first diode 41, for example +15 V, above this reference-ground potential. The remaining part of the blocking voltage, that is to say the difference between the drain potential and this potential on the fourth electrode, is absorbed essentially by the lightly doped drift control zone 3, in which a space charge zone is formed starting from the pn junction between the drift control zone and the p-doped zones 33, 34.

When the component is switched off, the potential in the p-doped semiconductor zones 33, 34 is greater than the potential on the body zone 8 by the value of the breakdown voltage of the diode 41 in these zones 33, 34 which are arranged adjacent to the body zone 8 and, respectively, adjacent to the heavily doped short-circuit zone 17 above the drift control zone 3, and holes are accumulated in the p-doped zones in the area of the dielectric 4. This part of the structure when the component is switched off corresponds to a capacitance which has been charged to the breakdown voltage of the diode, and is referred to in the following text as a storage capacitance.

When the MOSFET is switched on, that area of the drift zone 2 which is arranged close to the body zone 8 falls quickly to potentials below the breakdown voltage of the first diode 41. In consequence, holes are drawn away from the upper area of the drift control zone 3, that is to say the area which is located close to the fourth electrode 19, and are shifted to areas which are located further downwards, that is to say in the direction of the drain electrode 11. The holes there result in an accumulation of electrons on the opposite side of the dielectric 4, that is to say on the side of the drift zone 2 which faces the drift control zone 3. The charge is thus shifted from the storage capacitance to a lower "accumulation capacitance".

The first heavily n-doped connection zone 31 in conjunction with the second p-doped connection zone 32 prevents the holes from being able to flow away from the drift control zone 3 to the drain region 5 and to the drain connection 11 when in the on state. The drift zone 2 may be regarded as a control electrode for a hole channel on the side of the heavily n-doped connection zone 31 facing the drift zone 2. It is absolutely essential to prevent the formation of this hole channel, in order to maintain the necessary hole accumulation in the drift control zone 3. In order to increase the magnitude of the threshold voltage of the channel, a correspondingly heavy donor concentration should preferably be provided in the heavily n-doped connection zone 31, or a local increase in the thickness of the dielectric 2 should be provided to the height of the connection zone 31 (not illustrated). In this case, it is sufficient to choose the donor concentration in the first connection zone 31 to be particularly heavy in the lateral direction in the area which is connected directly to the dielectric 4, in order to avoid the formation of a hole channel; lighter doping can be chosen in the other areas of the connection zone 31. In this case, it may be sufficient not to increase the doping in the connection zone 31 in the area adjacent to the dielectric 4 in the vertical direction over the entire width of the connection zone 31, but only in places.

The hole charge which is responsible for the formation of an electron accumulation channel on the side of the drift zone 2 facing the drift control zone 3 and thus for the low on-state losses is largely maintained by the appropriate dimensions of the connection zones 31, 32. Only a relatively small proportion is lost by recombination and by the current below the threshold current through the layer 31 along the dielectric 4.

While in the off state, thermally generated electrons can flow away out of the drift control zone 3 via the arrangement with the first and second connection zones 31, 32.

In the case of the component illustrated in FIG. 16, the holes which are required in the drift control zone 3 when the component is switched on are thus shifted only between the lower n-doped "accumulation area" 2 and the upper p-doped "storage area" 33, 34, so that all that takes place here is a charge movement, and the holes need not be fed from the drain-source current through the component on each switching-on process. The switching losses of the component are thus minimized.

The storage capacitance which is illustrated in FIG. 16 need not necessarily be completely a component of the semiconductor body 1. A further capacitance can also be provided in addition to the storage capacitance which is formed by the body zone 8, the p-doped zones 33, 34 and the dielectric, and may also be arranged outside the semiconductor body.

An arrangement with an additional capacitance 50 such as this is illustrated in FIG. 17a. In this case, this capacitance is illustrated schematically as a capacitor, and will be referred to in the following text as an external capacitance, which may be provided in any desired manner inside or outside the semiconductor body. This further capacitance 50 is connected between the source electrode 13 and the fourth electrode 34.

The p-doped storage area 33, 34 can be replaced by a heavily n-doped connection zone 33, as illustrated in FIG. 12.

The p-doped connection zones 33, 34 have the advantage that their leakage current response is better.

In order to allow the full extent of the improved on-state losses of the component in comparison to conventional components to be exploited, it should be ensured that the storage capacitance, irrespective of whether it is an internal capacitance as illustrated in FIG. 16 or an external capacitance as illustrated in FIG. 17a, should be charged on switching on the component, and by the charges which are lost as a result of recombination of the charge carriers being replenished again.

With reference to FIG. 17a, this can also be achieved by connecting the anode 42a of a second diode 42 to the gate electrode 15, and its cathode 42b to the fourth electrode 19, and to the connection of the external capacitance that is remote from the source electrode 13. In order to ensure that a sufficient amount of the charge which shifted on switch on remains in the drift control zone 3 in the form of holes, the p-doped zone 34 above the drift control zone must be sufficiently heavily doped.

An external capacitance 50 and a second diode 42 may also be provided in a corresponding manner for the component illustrated in FIG. 12, as is illustrated by dashed lines there.

When the MOSFET is first switched on, the storage capacitance—provided that it has not already been charged by the off-state current from the drift control zone 3—is charged via the second diode 42 from the gate circuit. When the MOSFET is in the switched-on state, holes which have been lost are replenished without any delay from the gate circuit by recombination. During the dynamic changing of the charge on the storage and accumulation capacitance, no current is in this case drawn from the external control connections, that is to say the gate electrode 15, in the steady state.

In order to prevent the storage capacitance from being discharged to the drain zone 5, when the drain potential falls below the potential of the drift control zone 3, a pn junction is preferably provided between the drift control zone 3 and the drain electrode 11 and, in the case of the component illustrated in FIG. 17a, is formed by an n-doped first connection zone 31 connected to the drift control zone 3 and by a more lightly p-doped second connection zone 32, which is connected to the drain electrode 11.

For correct operation of this arrangement, it is also necessary for the diode which is formed by the first and second connection zones 31, 32 to have a higher blocking voltage than the maximum permissible gate voltage for switching on the MOSFET.

FIG. 17b illustrates a component which has been modified with respect to FIG. 17a, in which the drift control zone 3 is connected to the drain electrode 11 via an optional heavily doped first connecting zone 31, whose doping may correspond to the doping of the drain zone 5, and a tunnel dielectric 4'. The tunnel dielectric 4' prevents holes which have been accumulated in the drift control zone 3 being able to flow away to the drain electrode 11 in the on state, and allows a thermally generated leakage current to flow away to the drain electrode 11 in the off state. The withstand voltage of the tunnel dielectric 4' need in this case only be sufficiently high to ensure that it can block the gate voltage.

In the case of the component illustrated in FIG. 17b, monocrystalline semiconductor material is located above the tunnel dielectric 4'. A component such as this can be produced by growing the semiconductor material epitaxially on the tunnel dielectric. In this case, the drain zone 5 represents the substrate to which the tunnel oxide is applied, and on which the epitaxial layer is then grown. In this case—in contrast to the situation in FIG. 17b—the tunnel dielectric 4' is located between the drift control zone 3 and the heavily n-doped drain zone 5.

FIG. 18 illustrates a further possible way to prevent the storage capacitance from being discharged. In this case, the drift control zone 3 is connected via a heavily doped connecting zone to a second electrode 12, which is separate from the drain electrode 11, and a third diode 43 is connected between these two electrodes 11, 12 and may also be in the form of an external component, with its anode 43a being connected to the drain electrode 11, and its cathode 43b being connected to the second electrode 12. This third diode 43 prevents the accumulation capacitance from being discharged to the drain zone 5. In this case, the blocking capability of the third diode 43 must be higher than the maximum gate voltage for switching on the MOSFET, and lower than the maximum permissible potential difference across the dielectric 4, in order to allow thermally generated charge carriers to flow away to the drain electrode 11 in the off state in the space charge zone in the drift control zone 3, rather than leading to destruction of the dielectric 4.

When the MOSFET is first switched on, the drift control zone 3 is charged from the gate circuit to a maximum gate voltage, for example to 10 V. When the MOSFET is switched off, the charge is shifted from the accumulation capacitance to the storage capacitance. The storage capacitance must in this case be chosen to be sufficiently large that the blocking voltage of the second diode 42, for example 15V, is not exceeded. The storage capacitance is preferably two to three times the accumulation capacitance between the drift control zone 3 and the drift zone 2, and includes the sum of the internal capacitance formed by the connection zones 33, 34 and the bypass zone 17, as well as the optional external accumulation capacitance 50.

Instead of having to provide an external storage capacitance 50 outside the component, a capacitance such as this can also be integrated in the component, for example in the semiconductor body 1. In particular, the storage capacitance to the bypass zone 17 can be increased by means of a dielectric 4 with a higher dielectric constant and/or by enlarging the boundary area between the hole bypass 17 and the dielectric 4.

In the arrangement illustrated in FIG. 18, it is also possible in principle to dispense with the first diode 41. However, it is then possible for any excess charges to flow away from the storage capacitance into the gate circuit. Excess charges such as these may occur in particular when the storage capacitance is charged to the blocking voltage of the second diode 42 by the leakage current from the drift control zone 3 during a relatively long-lasting off phase.

FIG. 19 illustrates a further possible way to link the drift control zone 3 to the drain zone 5. In this case, the drift control zone 3 is connected to the drain zone 5 directly and without the interposition of the drain electrode 11, via the connection zones 31, 32. This is achieved by the dielectric 4 starting at a distance from the drain electrode 5, and by the drain zone 5 extending underneath the drift control zone 3 in the lateral direction.

As in the case of semiconductor components, in particular as is normal in the case of power semiconductor components, a plurality of individual cells, in the present case a plurality of MOSFET cells, can be arranged in the same semiconductor body and can be connected in parallel with one another. In the case of the component according to the invention, two adjacent cells of the component can in this case use a common drift control zone 3 located between them.

Figure 20:
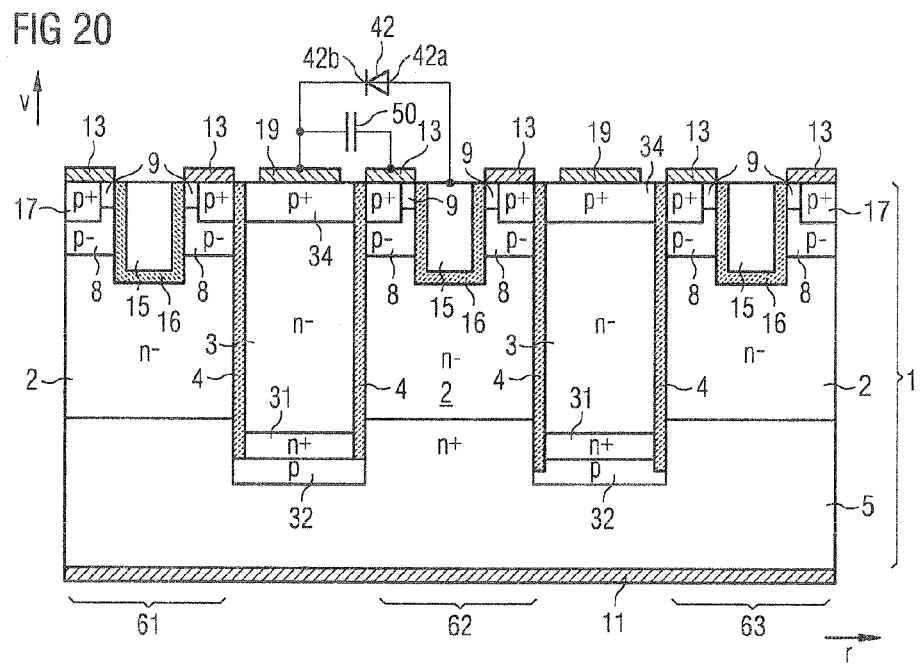
FIG. 20 illustrates a cross section through a MOSFET with a plurality of drift control zones, each of which is connected on the drain side to the drain zone via an integrated diode, and in which the drift control zone extends into the drain zone in the vertical direction.

FIG. 20 illustrates a cross section through a section of a component according to the invention which is in the form of a MOSFET and has a plurality of MOSFET cells 61, 62, 63. Each of the MOSFET cells 61, 62, 63 has a source zone 9, a body zone 8, a drift zone 2, a bypass zone 17, a gate electrode 15, gate isolation 16 and a source electrode 13. The drain zone 5 and the drain electrode 11 are in this case shared by all of the MOSFET cells 61, 62, 63.

A drift control zone 3 is in each case arranged between each two adjacent MOSFET cells 61, 62, 63 and is connected on the drain side to the drain zone 5 via a diode 31, 32 which is formed from the first and second connection zones 31, 32. The dielectric 4 may in this case extend as far as the third connection zone 32, as is illustrated in the left-hand part of FIG. 20, or may extend into the third connection zone 32, as is illustrated in the right-hand part of FIG. 20. Furthermore, the dielectric can also be produced in such a way that it ends only in the drain zone 5 in the vertical direction (not illustrated).

On the source side, each of the drift control zones 3 is connected to a fourth electrode 19 via a heavily p-doped fourth connection zone 34. In this case, the storage capacitance is formed predominantly by an external capacitance 50. In this case as well, the third connection zone 33 can also optionally be formed between the fourth connection zone 34 and the drift control zone 3.

In order to connect the individual MOSFET cells 61, 62, 63 in parallel, the source electrodes 13, the gate electrodes 15 and the fourth electrodes 19 of the individual cell are each connected to one another. The electrical connection is preferably made by at least one structured metallization layer, which is not illustrated in FIG. 20 but is arranged above the front face or source side of the semiconductor body 1.

A dielectric 4 is arranged at least in places between adjacent drift and drift control zones 2, 3. The dielectric 4 is preferably designed to be closed over the entire area between respectively adjacent drift and drift control zones 2, 3. On the drain side, the dielectric 4 preferably extends at least as far as the drain zone 5. However, it may also extend as far as the drain-side surface of the semiconductor body 1.

According to one preferred embodiment of the invention, the drift zones 2 and the drift control zones 3 have the same doping profile in the area in which they extend jointly in the vertical direction v, thus resulting in the off state in a similar potential distribution in the drift control zone and in the drift zone, so that the voltage load on the dielectric 4 is low.

The drain-side reverse-biased pn junctions 31, 32 for connection of the drift control zones 3 to the drain zone 5 are arranged within the drain zone 5 in the vertical direction v in the exemplary embodiment illustrated in FIG. 20.

Figure 21:
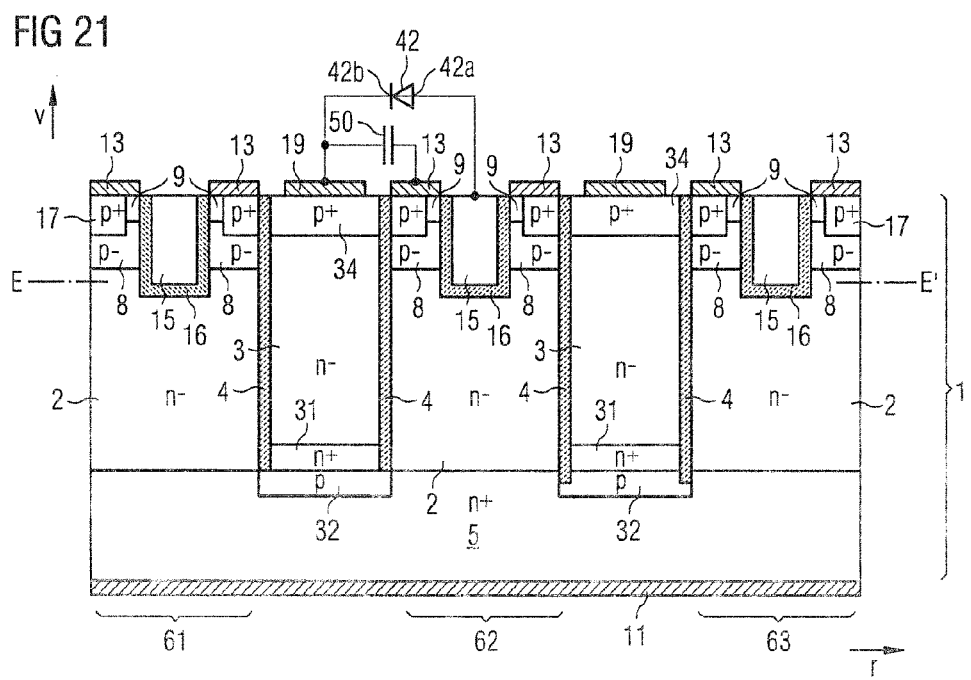
FIG. 21 illustrates a MOSFET corresponding to the MOSFET illustrated in FIG. 20, in which the drift control zone is separated from the heavily doped connecting zone in the vertical direction.

In contrast to this, in the case of the MOSFET illustrated in FIG. 21, the first connection zone 31 is arranged in the area of the drift zones 2 in the vertical direction v, and the second connection zone 32 is arranged in the area of the drain zone 5 in the vertical direction v.

The individual cells may have a large number of different geometries. FIGS. 22, 23, 24, 25 illustrate horizontal sections through components with different cell geometries.

FIG. 22 illustrates a cross section, running at right angles to the vertical direction v, through a MOSFET as illustrated in FIG. 21 on a plane E-E' for strip cells. The individual areas of the MOSFET cells 61, 62 are in this case formed with a strip-like cross section in a first lateral direction r and are arranged spaced apart from one another in a second lateral direction r', with a drift control zone 3 and a dielectric 4 in each case being arranged between two adjacent MOSFET cells 61, 62.

FIG. 23 illustrates a cross section through a MOSFET with a rectangular cell structure. Drift control zones 3 which are arranged between adjacent MOSFET cells 61, 62, 63 are in this case designed to be cohesive. As an alternative to this, the individual drift control zones 3 which are arranged between two adjacent MOSFET cells may, however, also be designed not to be cohesive.

FIG. 24 illustrates a cross section through a MOSFET whose MOSFET cells are designed to have a round cross section, rather than a rectangular cross section as in the case of FIG. 23.

FIG. 25 illustrates a modified form of the strip-type layout illustrated in FIG. 22. In the case of this cell structure, which has a meandering cross section, the individual areas of the MOSFET cells are elongated, but have meandering bulges at specific intervals.

The present invention is not restricted to MOSFETs but can also be applied to any desired power semiconductor components, in particular to unipolar power semiconductor components. The following figures illustrate the application of the principle according to the invention to a Schottky diode.

FIG. 26 illustrates a Schottky diode with a metallic anode 13, which makes contact with a lightly n-doped drift zone 2 and forms a Schottky junction 60 with it. A heavily n-doped connecting zone 5 is arranged on the side of the drift zone 2 remote from the Schottky junction 60, and makes contact with a cathode electrode 11.

A lightly n-doped, monocrystalline drift control zone 3 is provided adjacent to the drift zone 2, and is separated from the drift zone by a dielectric layer 4. In the case of the component illustrated in FIG. 26, the drift control zone 3 is connected to a connection zone 31 which is more heavily doped than the drift control zone 3 and electrically connects the cathode side of the drift control zone 3 to a second electrode 12.

According to one preferred embodiment, the drift zone 2 and the drift control zone 3 extend over the same area in the vertical direction v, and preferably have the same doping profile in the vertical direction v. In the same way, the connecting zone 5 and the first connection zone 31 extend over the same area in the vertical direction v, and preferably have the same doping profile in the vertical direction v.

The cathode electrode 11 and the second electrode 12 are electrically isolated from one another.

In the forward-biased current flow direction, the Schottky diode as illustrated in FIG. 26 has a diode current $I_D$ between the anode electrode 13 and the cathode electrode 11 which is significantly greater than the diode current $I_D$ through the same component when the cathode electrode 11 and the second electrode 12 are short-circuited. The last-mentioned case of a cathode electrode 11 which is short-circuited to the second electrode 12 corresponds—apart from the dielectric 4—to a conventional Schottky diode without a drift control zone.

For operation of a Schottky diode according to the invention and as illustrated in FIG. 26, it is necessary for the cathode side of the drift control zone 3 to be connected, preferably with a high impedance, to the connecting zone 5, so that an electrical potential profile can be formed in the drift control zone which leads to the formation of a charge carrier accumulation in the drift zone 2.

FIGS. 27 and 28 illustrate the diode current $I_D$ as a function of the diode voltage $U_D$, respectively in the form of a linear and a logarithmic plot. In this case, the characteristic 51 represents the current/voltage characteristic of the diode according to the invention as illustrated in FIG. 26, with the second electrode 12 being connected with a high impedance to the cathode electrode 11. The characteristic 51 compared with this is the current/voltage characteristic 52 for the same diode in the situation in which the cathode electrode 11 and the second electrode 12 are short-circuited.

The operating points 53 illustrate the relationships for a conventional Schottky diode without a drift control zone and without a dielectric, whose drift zone also extends over the area of the dielectric 4 and of the drift control zone 3 of the Schottky diode as illustrated in FIG. 26 in the lateral direction, and which thus has a larger cross-sectional area than the drift zone 2 of the Schottky diode as illustrated in FIG. 26, which carries the steady-state current.

To a very good approximation, the operating points 53 are located on the characteristic 52 of a conventional Schottky diode. This illustrates that the short-circuit between the cathode electrode 11 and the second electrode 12 results in a Schottky diode with the characteristics of a conventional Schottky diode of the same width. Any deviation which may possibly be caused by the additional dielectric 4 between the operating points 53 and the characteristic 52 is negligible because of the small dimensions of the dielectric 4.

The reason for this highly different profile of the characteristics 51, 52 can be explained by a highly inhomogeneous, channel-like electron distribution in the drift zone 2 of the Schottky diode according to the invention, which is caused by the high-impedance cathode-side connection of the drift control zone 3 to the connecting zone 5.

FIG. 29 illustrates an electron distribution such as this when a voltage with a magnitude of 5 V is applied between the cathode electrode 11 and the anode electrode 13. As can be seen, a zone with an increased electron concentration and with an electron density of about $10^{17}$ electrons/cm$^3$ is formed on the side of the drift zone 2 facing the drift control zone 3. This is caused by the electric field which is established in the drift control zone as a consequence of its high-impedance connection to the connecting zone 5.

The high-impedance connecting resistance for connection of the drift control zone 3 to the connecting zone 5 should be sufficiently small to dissipate the heat leakage flow from the area of the connecting zone 5 that is close to the cathode electrode, when the Schottky diode is reverse-biased, to the cathode electrode 11 without any significant voltage drop.

On the other hand, the connecting resistor must be considerably greater than the bulk resistance of this region of the connecting zone 5 which is close to the electrode, in order to allow accumulation when the Schottky diode is connected in the forward-biased direction. For a Schottky diode with a reverse withstand voltage of 600 V, sensible values for the cathode-side specific connection resistance between the connecting zone 5 and the drift control zone 3 are in the range from 1 to $10^4$ $\Omega \cdot$cm$^2$. Various possible ways are indicated in FIGS. 30 to 36 and in the following text by means of which connection resistance such as this can be implemented.

In the case of the Schottky diode illustrated in FIG. 30, a lightly p-doped first connection zone 31 is provided for this purpose and connects the drift control zone 3 on the cathode side to the drift zone 2 via the cathode electrode 11 and the heavily n-doped connecting zone 5.

The Schottky diode as illustrated in FIG. 31 has the same configuration as the Schottky diode illustrated in FIG. 30, with the difference that the first connection zone 31 is not lightly p-doped, but is in the form of an intrinsic, that is to say undoped, semiconductor region, or a semiconductor region with lighter 3 n$^-$-doping than the drift control zone.

With reference to FIG. 32, there is no need to couple the drift control zone 3 to the drift zone 2 with the interposition of the cathode electrode 11. Instead of this, by way of example, the first connection zone 31 can be coupled to the drift zone 2 via the heavily doped connecting zone 5, bypassing the cathode electrode 11. According to one preferred embodiment of the invention, the first connection zone 31 can in this case make direct contact with the heavily doped connecting zone 5. In order to allow this, the dielectric 4 is separated from the cathode-side surface of the semiconductor body 1, at least in places. However, the dielectric 4 must be configured such that there is no direct connection between the drift zone 2 and the drift control zone 3 anywhere.

The exemplary embodiment illustrated in FIG. 33 provides for the drift control zone 3 to make direct contact with the heavily doped connecting zone 5. For this purpose, the dielectric 4 does not extend to the cathode-side surface of the semiconductor body 1, at least in places. In this area between the dielectric 4 and the cathode-side surface of the semiconductor body 1, a section 56 of the drift control zone 3 extends as far as the heavily doped connecting zone 5, and makes contact with it. The electrical contact resistance between the drift control zone 3 and the drift zone 2 can be set in particular by the geometric dimensions of this projection 56.

However, instead of a section 56 of the drift control zone 3, a different electrically resistant material can also be introduced, which electrically connects the drift control zone 3 to the connecting zone 5.

In the exemplary embodiment illustrated in FIG. 34, the cathode-side connection of the drift control zone 3 to the connecting zone 5 is provided by means of a resistance 55, which is in the form of a layer and is applied to the cathode side of the semiconductor body 1. The resistance 55 in this case makes contact not only with a first heavily n-doped connection zone 31 but also with the heavily doped connecting zone 5.

In the exemplary embodiment illustrated in FIG. 35, the dielectric 4 also extends in places between the cathode-side end of the drift control zone 3 and the cathode electrode 11, which extends underneath the drift control zone 3 in the lateral direction.

In the area between the drift control zone 3 and the cathode electrode 11, the dielectric 4 has one or more cutouts 57, which are filled with resistive material. The contact resistance between the drift control zone 3 and the connecting zone 5 can be set specifically as a function of the number and size of the cutouts 57 as well as the resistivity of the resistive material introduced into them. n-doped, p-doped or intrinsic semiconductor material is also particularly suitable for use as the resistive material.

The exemplary embodiment illustrated in FIG. 36 illustrates one special feature. In this case, the drift control zone 3 is connected on the anode side to the metal 13 of the Schottky junction 60. This lightly p-doped third connection zone 33 means that there is no bipolar charge carrier injection, as a consequence of the high-impedance cathode-side connection of the drift control zone 3 to the drift zone 2.

The lightly p-doped third connection zone 33 has a similar effect to the corresponding p-doped regions of a merged pin Schottky diode in terms of field shielding, and thus reduces the electrical field strength at the Schottky junction 60. However, since there is no significant current flow in the area of the drift control zone 3, there is no injection behavior, which is also undesirable in the case of a merged pin Schottky diode, in this case either, and there is therefore no undesirable increase in the switching-off losses as a result of injected charge carriers being cleared out of the drift control zone 3.

In the exemplary embodiment illustrated in FIG. 36, the drift zone 2 and the drift control zone 3 are electrically connected on the cathode side via a symbolically illustrated resistance 55. In principle, this resistance may be provided in any desired way. The electrical connection may, however, be implemented in particular in accordance with the exemplary embodiments illustrated in FIGS. 29 to 35 as well as 37 to 40.

FIG. 37 illustrates an embodiment in which the resistive connection between the drift control zone 3 and the connecting zone 5 is provided by the cathode electrode 11 overlapping the drift control zone 3 in places in a section 11'. In this case, the value of the contact resistance can be set by the width of the contact surface 11'.

The pure resistance which can be produced in various ways between the drift control zone 3 and the connecting zone 5 can be replaced by a tunnel dielectric, in particular a tunnel oxide, as will be explained with reference to the following figures.

In the Schottky diode illustrated in FIG. 38, the connecting electrode 11 completely covers the area of the drift control zone 3 and of the drift zone 2, with the drift control zone 3 being connected to the connecting electrode 11 via an optional heavily doped connecting zone 31 and a tunnel dielectric 4'. The drift control zone 3 is optionally connected to the anode electrode 13 via the third connection zone 33.

The component illustrated in FIG. 39 is in the form of a merged pin Schottky diode, and has a p-doped injection zone 33', which is connected to the anode electrode 13, in places in the drift zone 2. The injection zone 33' may in this case and as illustrated in FIG. 39 be adjacent to the dielectric 4, or else may be laterally separated from it. The latter variant (not illustrated) makes it easier to connect the Schottky junction 60 to the accumulation channel which is formed at the boundary between the drift zone 2 and the dielectric 4.

The component illustrated in FIG. 40 differs from the component illustrated in FIG. 38 in that the dielectric 4 does not extend as far as the cathode electrode 11, and in that the connecting zone 5 extends under the tunnel dielectric 4', so that the drift control zone 3 is connected to the connecting zone 5 via the optional heavily doped connection zone 31 and the tunnel dielectric 4'.

The present invention has been explained by way of example with reference to a MOSFET and a Schottky diode. Particularly in the case of a MOSFET, it is possible to provide a p-channel MOSFET instead of the n-channel MOSFET that is illustrated. In this case, in the illustrated exemplary embodiments of an n-channel MOSFET, all of the n-doped semiconductor zones would have to be replaced by p-doped semiconductor zones, and, conversely, all of the p-doped semiconductor zones would have to be replaced by n-doped semiconductor zones. This also relates in particular to the first, the second and the third diodes, that is to say these diodes must be connected in the opposite polarity to the corresponding but complementarily doped regions.

The concept according to the invention can be applied to any desired unipolar components which have a drift zone, in particular also to JFETs.

Finally, it should also be noted that monocrystalline semiconductor material need not necessarily be used for the provision of the drift control zone, but that polycrystalline semiconductor material can also be used, which satisfies the doping rule as explained above, on the basis of which the quotient of the dopant charge divided by the area of the dielectric is less than the breakdown charge. When using a polycrystalline semiconductor material for the drift control zone 3, however, higher leakage currents must be borne in mind, which result from increased charge carrier generation at the grain boundaries between individual crystals of the polycrystalline material.

Figure 41:
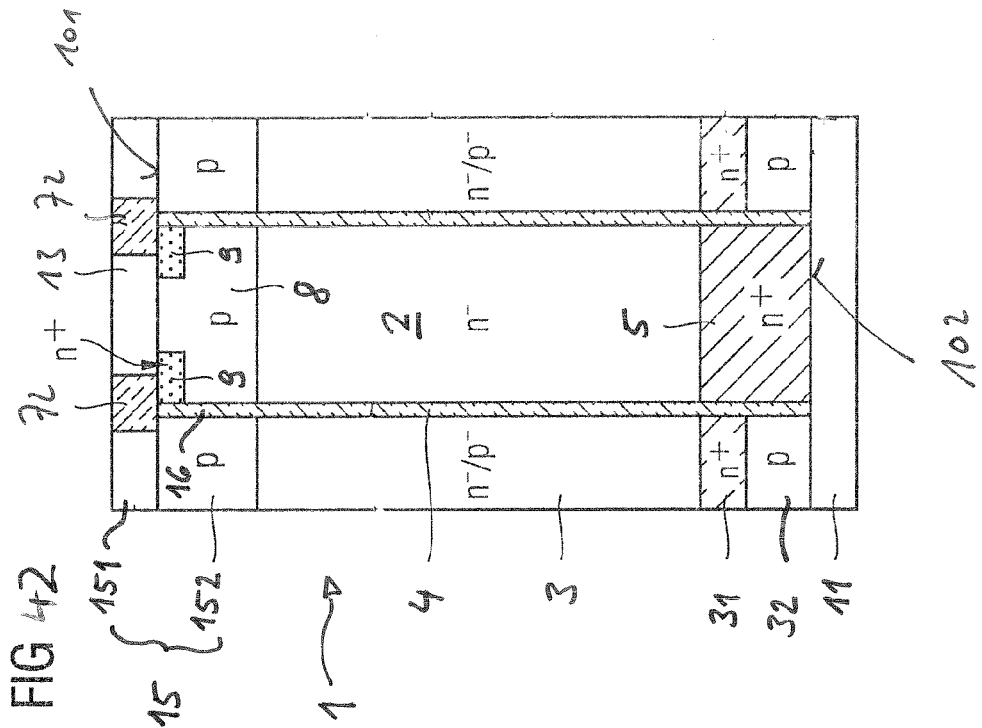
FIG. 41 illustrates a semiconductor component in the form of a MOSFET, in which the drift control zone is directly adjacent to the gate electrode on one side, and is coupled to the drain zone via a diode on the other side.

FIG. 41 illustrates a further exemplary embodiment of a power semiconductor component according to the invention in the form of a MOSFET. The gain electrode 15 and the drift control zone 3 are arranged adjacent to one another in the vertical direction of the semiconductor body 1 in this component, with the gate electrode 15 being connected directly to the drift control zone 3. In this component, the gate electrode 15 is in two parts and includes a connecting electrode 151, which is arranged above the front face of the semiconductor body 1, and which is isolated from the source electrode 13 by means of an isolation layer 72. A p-doped semiconductor section 152 is connected to this connecting electrode 151 in the vertical direction, is arranged adjacent to the body zone 8 in the lateral direction of the semiconductor body 1, and is separated from the body zone 8 by the gate dielectric 16. This semiconductor zone 152 carries out the actual function of the gate electrode and is used, when a suitable drive potential is applied, to form a conductive channel between the source drain 9 and the drift zone 2 in the body zone 8 along the gate dielectric 16.

The semiconductor zone 152 of the gate electrode 15 is p-doped in the n-conductive MOSFET illustrated in FIG. 41. The drift control zone 3 which is immediately adjacent to this semiconductor zone 152 is either n-doped or p-doped, with its doping concentration being lighter than the doping concentration of the semiconductor zone 152. By way of example, the drift control zone is doped in the region of $1 \cdot 10^{14}$ cm$^{-3}$, and may correspond to the doping concentration of the drift zone 2. The doping concentration of the semiconductor zone 152 may in this case correspond to the doping concentration of the body zone 8.

The n-MOSFET which is illustrated in FIG. 41 is switched on when a positive voltage is applied between the drain zone 5 and the source zone 9 and when a drive potential which is higher than the potential on the source and body zones 9, 8 is applied to the gate electrode 15. This positive drive potential on the gate electrode 15 leads to the formation of an inversion channel in the body zone 8 between the source zone 9 and the drift zone 2. When the component is switched on, the drift control zone 3 is approximately at the same potential as the gate electrode 15, which leads to the formation of an accumulation channel in the drift zone 2 along the accumulation dielectric 4. When the component is switched on completely, the potential on the drain zone 5 is normally lower than the potential on the gate electrode 15, so that the accumulation channel is formed completely in the vertical direction along the accumulation dielectric 4 between the body zone 8 and the drain zone 5.

A diode 43 which is connected between the connecting electrode 12 of the drift control zone 3 and the drain zone 5 or the drain electrode 11 prevents holes which produce the accumulation channel and are present in the drift control zone 3 from flowing away in the direction of the drain zone 5 or of the drain electrode 11 during this switching state.

Figure 42:
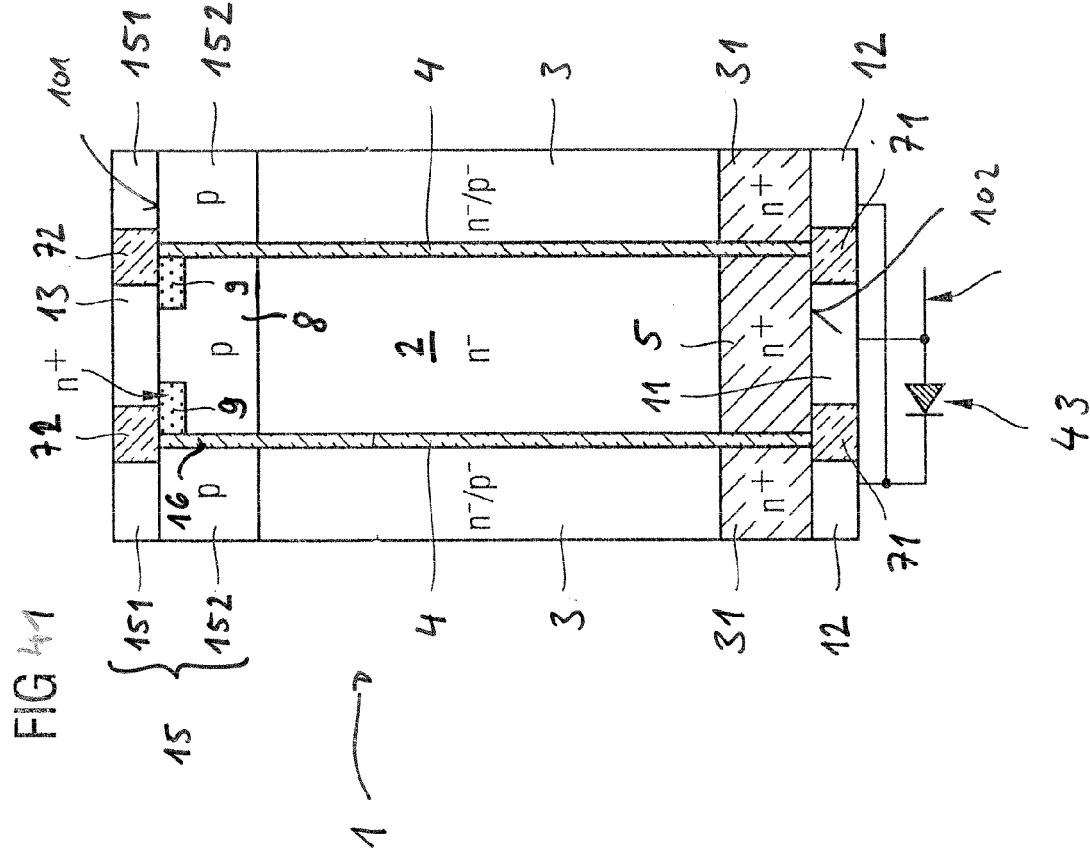
FIG. 42 illustrates a component which has been modified with respect to the component illustrated in FIG. 41, in which the diode is in the form of an integrated diode.

This diode 43, of which only the circuit symbol is illustrated in FIG. 41, may be regarded as an external diode. With reference to FIG. 42, it is also possible to integrate this diode 43 in the drift control zone by providing a semiconductor zone 32 which is doped in a complementary manner to the connecting zone 31 and in a complementary manner to the drain zone 5 between the heavily doped connecting zone 31 of the drift control zone 3 and the drain electrode 11. As already explained in conjunction with FIG. 16, the object of this diode 43 is to prevent holes from flowing out of the drift control zone 3 to the drain zone 5.

The gate dielectric 16 and the accumulation dielectric 4 in the case of the components illustrated in FIGS. 41 and 42 may be in the form of a common dielectric layer, extending in the vertical direction of the semiconductor body 100. In the case of the components illustrated in FIGS. 41 and 42, these dielectric layers each run over the entire depth of the component in the vertical direction, that is to say these dielectric layers extend from the front face to the rear face of the semiconductor body 1.

Figure 43:
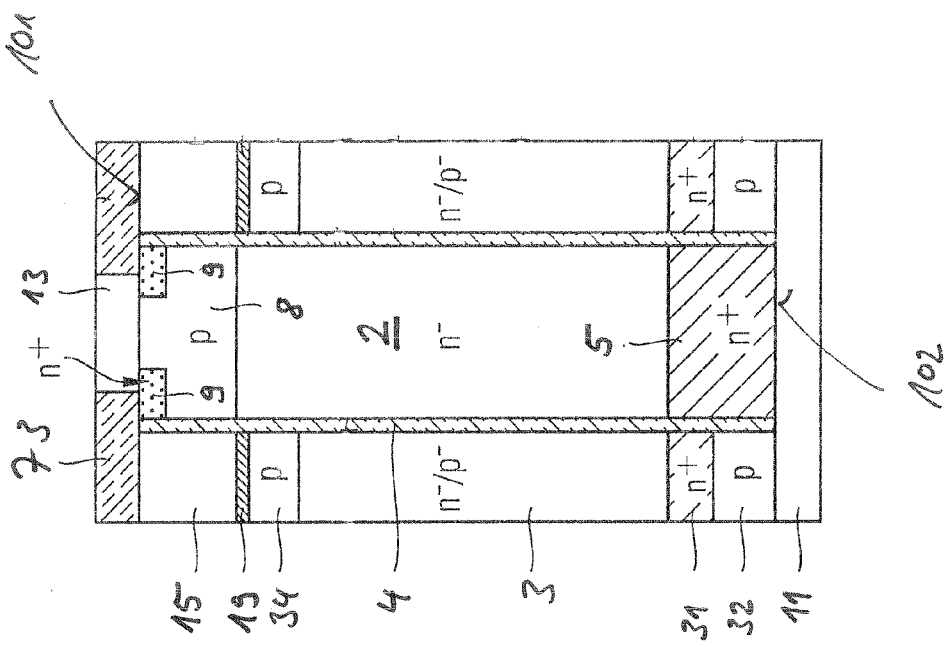
FIG. 43 illustrates a further component which has been modified with respect to the component illustrated in FIG. 41.

FIG. 43 illustrates a component which has been modified with respect to the component in FIG. 42, in which the accumulation dielectric 4 ends before the rear face 102 of the semiconductor body 1, so that the drain zone 5 and the p-doped connecting zone 32 are adjacent to one another in places in the lateral direction. The n-doped connecting zone 31 and the drain zone 5 are, however, completely separated from one another by the accumulation dielectric 4 in the lateral direction of the semiconductor body.

Figure 44:
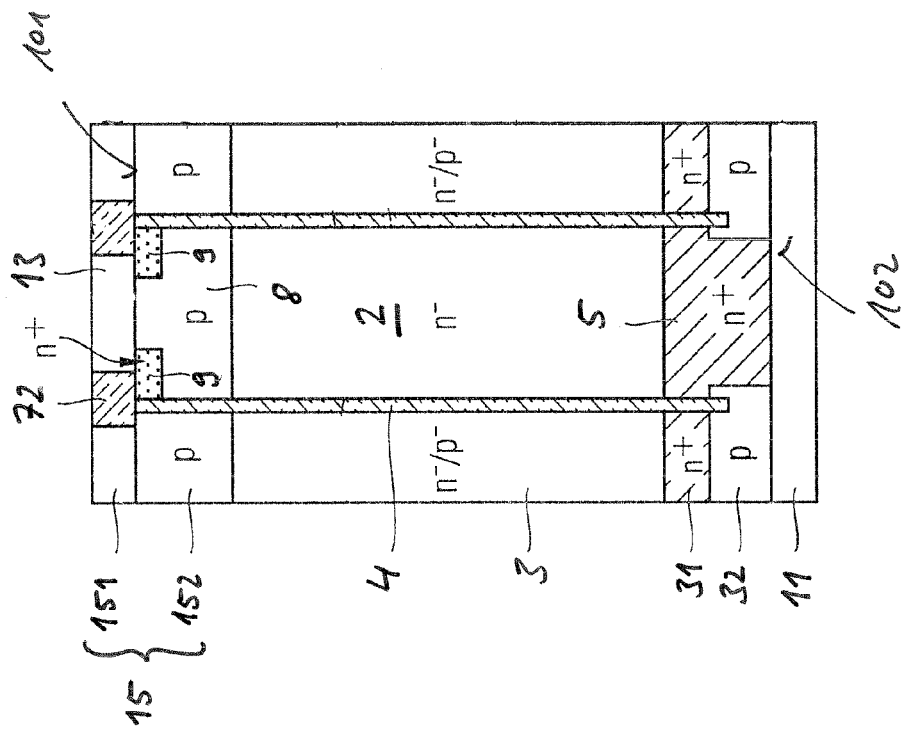
FIG. 44 illustrates a component which has been modified with respect to the component illustrated in FIG. 42, in which the drift control zone is connected to the gate electrode via a contact electrode.

FIG. 44 illustrates a further component which has been modified with respect to the component in FIG. 42. The drift control zone 3 in this case has a connecting zone 34, which is more heavily doped than the drift control zone 3 and is p-doped in this example, in the direction of the gate electrode 15. This connecting zone 34 is connected to the gate electrode 15 via a connecting electrode 19 which is composed, for example, of a silicide or a metal. In the case of this component, the gate electrode 15 may be composed of a metal or of a heavily doped polysilicon.

The object of the conductive connecting electrode 19 is to electrically conductively connect the gate electrode 15 to the p-doped connecting zone 34 of the drift control zone 3 when using n-doped polysilicon for the gate electrode 15. Without the presence of this connecting electrode 19, a pn junction would otherwise be produced between the gate electrode 15 and the drift control zone 3, and this would impede the transport of charge carriers from the gate electrode 15 to the drift control zone 3. There is no need for the connecting electrode 19 if the gate electrode 15 is composed of a p-doped polysilicon.

FIG. 45 illustrates a modification of the MOSFET illustrated in FIG. 44. In the case of this component, the gate electrode 15 and the drift control zone 3 are isolated from one another by the provision of a further isolation layer 74 between the gate electrode 15 and the drift control zone 3. The connecting electrode 19, which is adjacent to the isolation layer 74, of the drift control zone 3 in the case of this component may have a drive potential that is separate from the gate potential applied to it, in a manner which is not illustrated in any more detail. This drive potential can be chosen in order to form an accumulation channel in the drift zone 2, such that it is at least greater than the source potential, that is to say the potential on the source electrode 13 or the source and body zones 9, 8. This drive potential may in this case also be higher than the drain potential, that is to say the potential on the drain zone 5, so that the drift control zone 3 is at a common potential, because of the reverse-biased diode 31, 32 connected between the drift control zone 3 and the drain zone 5. If the drive potential on the connecting electrode 19 is lower than the potential on the drain zone 5, then there is a voltage drop across the drift control zone 3 in the vertical direction, the formation of an accumulation channel in the drift zone 2 along the accumulation dielectric 4 is in this case not possible over the entire length of the accumulation dielectric 4, but in places in an area which is adjacent to the body zone 8, and this leads to a reduction in the on-state resistance.

FIG. 46E illustrates a semiconductor component which is in the form of a MOSFET and has been modified with respect to the component illustrated in FIG. 43. In the case of this component, a semiconductor zone 51 which is heavily doped continuously in the lateral direction and is adjacent to the drain electrode 11 is provided in the area of the rear face 102 of the semiconductor body 1. The connecting zones 31, 32, which are doped in a complementary manner to one another and form a diode, of the drift control zone 3 are arranged between this semiconductor zone 51 and the drift control zone 3, and an n-doped semiconductor zone is formed between this heavily doped semiconductor zone 51 and the drift zone 2, with this n-doped semiconductor zone forming the drain zone of the component and being composed of two semiconductor zones 52, 53 arranged one above the other.

In the case of this component, a section 52 of the drain zone 5 is adjacent to the p-doped connecting zone 32 of the drift control zone 3 in the lateral direction. In this component, the semiconductor zone 51 is used essentially as a substrate for the component structures arranged above it, and ensures a low-impedance electrically conductive connection between the drain electrode 11 and the drain zone 5.

A method for production of this component as illustrated in FIG. 46E will be explained in the following text with reference to FIGS. 46A to 46D.

With reference to FIG. 46A, this method starts with the provision on a semiconductor substrate 51 which, for example, is a heavily n-doped semiconductor substrate. In this context, it should be noted that the dimensions of the semiconductor substrate in the vertical direction and the dimensions of the component zones of the semiconductor component which will be explained in the following text are not illustrated to scale. The dimensions of the substrate 51 in the vertical direction are normally considerably larger than the dimensions of the further component zones or semiconductor layers which are still to be explained.

With reference to FIG. 46B, a semiconductor layer which has n-doped and p-doped semiconductor zones 52, 32 alternately in the lateral direction is applied to the semiconductor substrate 51. In this case, the p-doped zones form a part of the later diode via which the drift control zone 4 is connected to the drain zone or drain electrode. The n-doped semiconductor zones 52 form a part of the later drain zone of the component. The semiconductor layer which is applied to the semiconductor substrate 51 is produced, for example, by means of an epitaxial process, in which the different doping of the individual semiconductor zones can be produced even during the epitaxial process. Furthermore, it is also possible to first of all produce the semiconductor layer as a uniformly doped layer of one conductivity type, or as an intrinsically doped semiconductor layer, and to produce the semiconductor zones 32, 52 subsequently by means of an implantation process, by means of which the dopant atoms are introduced into the semiconductor layer.

With reference to FIG. 46C, three further semiconductor layers 53', 2', 9' are then deposited on this semiconductor layer with the semiconductor zones 32, 52 with complementary doping with respect to one another, of which a first layer 53' is n-doped in the example, a second layer 2' is n-doped more lightly than the first layer 53', and the third layer 9' is p-doped.

The third layer 9' forms a front face 101 of a semiconductor body 1 which is produced after deposition of these semiconductor layers.

With reference to FIG. 46D, trenches are then produced starting from this front face 101, and extend in the vertical direction of the semiconductor body into the p-doped semiconductor zones 32 of the semiconductor layer which was deposited first. These trenches are then filled with a dielectric material, for example a semiconductor oxide, which forms the accumulation dielectric 4 in the area of the second layer 2', and the gate dielectric 16 in the area of the third layer 9'.

The trenches with the dielectric arranged in them subdivide the three semiconductor layers 53', 2', 9' into individual semiconductor sections. The semiconductor sections of these semiconductor layers 53', 2', 9' form a part 53 of the drain zone 5, the drift zone 2 and the body zone 8 in an area above the n-doped semiconductor zones 52 of the first semiconductor layer. Above the p-doped semiconductor zones 32 of the first layer, these three semiconductor layers form a part 31 of the integrated diode, the drift control zone 3 as well as a part 152 of the gate electrode 15.

With reference to FIG. 46E, the production of the component is completed by production of the source zone 9 in the body zone. For this purpose, dopant atoms of a conductivity type which is complementary to the doping of the body zone are introduced into an area of the body zone 8 close to the surface. Finally, the source electrode 13 and the connecting electrodes 151 of the gate electrode 15 are produced above the front face 101. These electrodes 13, 151 may be produced by deposition of a metal layer or of a heavily doped polysilicon layer, with this layer subsequently being structured. The structure in this case includes the subdivision of this semiconductor layer into individual electrode sections, and the production of an isolation layer 72 between the individual electrode sections.

The integrated diode which connects the drift control zone 3 to the drain zone 5 is in the case of the component illustrated in FIG. 46E formed by the p-doped sections 32 of the semiconductor layer which was deposited first, as well as by the section 31 of the n-doped semiconductor layer which was deposited after this. In the case of this component, the drain zone 5 is formed by the n-doped sections 52 of the semiconductor layer which was deposited first, and by sections 53 of the n-doped semiconductor layer which was deposited subsequently.

A method which is modified with respect to the method illustrated in FIGS. 46A to 46E will be explained in the following text with reference to FIGS. 47A to 47D.

This method differs from the method illustrated in FIG. 46 by the method process for production of the source zone of the MOSFET. On the basis of the arrangement illustrated in FIG. 46D, in the case of the modified method as illustrated in FIG. 47, a heavily n-doped semiconductor layer 9''' is produced over the entire surface, starting from the front face 101, on the third semiconductor layer 9', and in places forms the subsequent source zone of the component. This semiconductor zone 9''' is produced, for example, by ion implantation over the front face 101 of the semiconductor body.

Figure 47B:
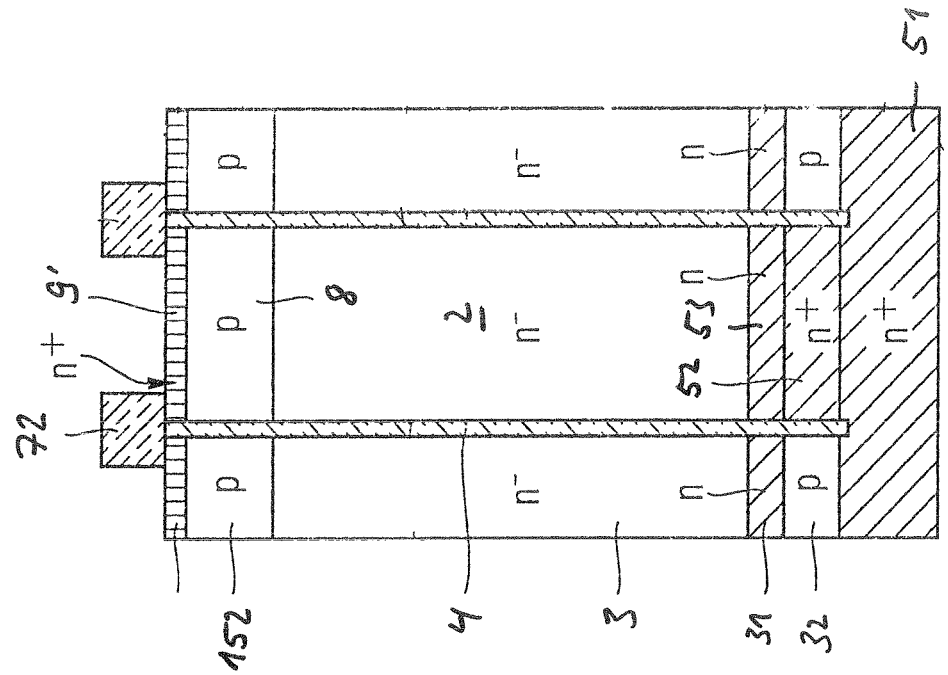
FIG. 47 illustrates a method for production of a further semiconductor component in the form of a MOSFET, in which the drift control zone is connected directly to the gate electrode, during individual method steps.
Figure 47A:
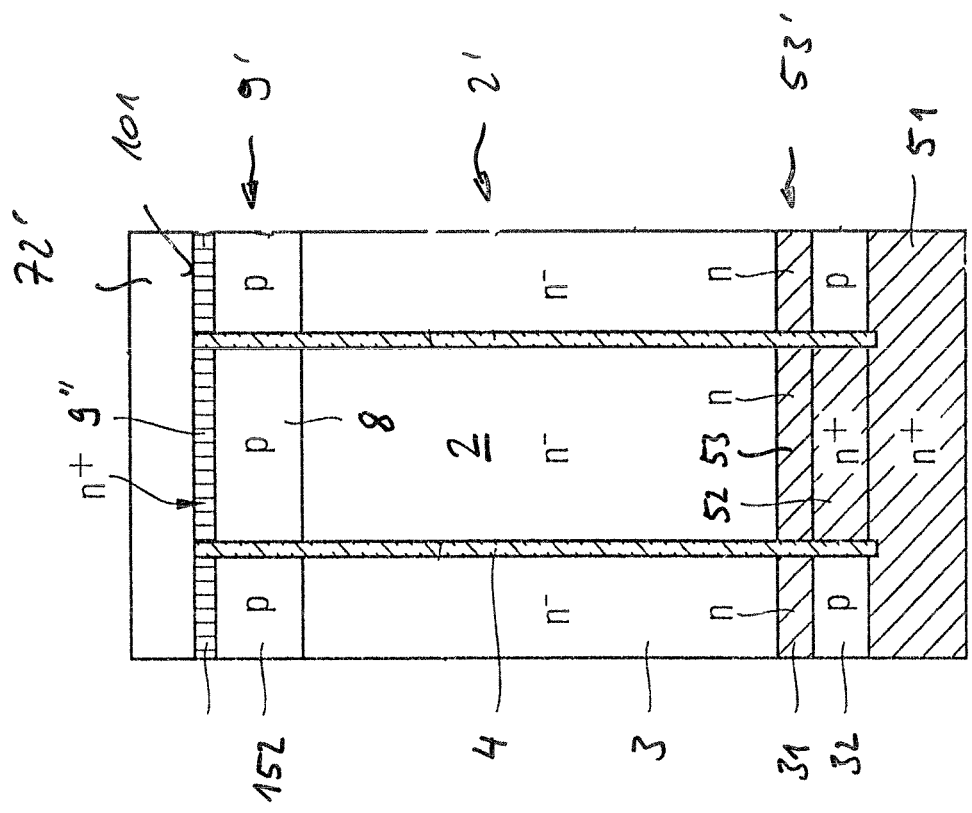

With reference to FIG. 47B, isolation areas 72 are then produced above the trenches with the dielectric material. These isolation areas may be produced by depositing an isolation layer followed by structuring of this isolation layer. The object of these isolation areas 72 is to electrically isolate the subsequent source electrodes and gate electrodes of the component from one another in the already explained manner. The dimensions of the isolation areas 72 above the trenches are chosen such that these isolation areas 72 overlap the heavily doped semiconductor zone 9''' on both sides of the trenches, in each case in places, in the lateral direction of the semiconductor body.

Figure 47C:
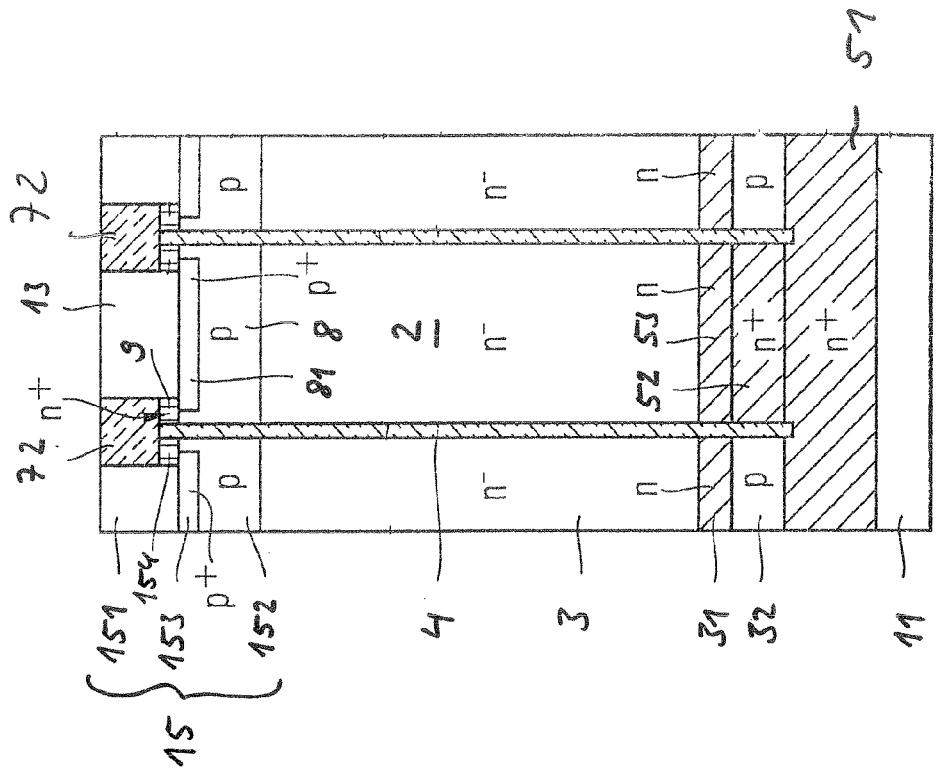

With reference to FIG. 47C, the heavily n-doped semiconductor layer 9''' is then removed in those areas which are not covered by the isolation sections 72. This can be done by means of an anisotropic etching process, in which an etching agent is used which etches the semiconductor layer 9''' selectively with respect to the isolation sections 72. After completion of this etching process, the body zones 8 and some of the semiconductor zones 152 which form the subsequent gate electrodes are exposed in places in the area of the front face 101 of the semiconductor body. In the case of the method explained with reference to FIG. 47, sections 9, 154 of the heavily doped semiconductor layer 9" remain underneath the isolation sections 72 on both sides of the trenches with the dielectric material. In this case, the n-doped areas 9 which remain above the body zone 8 form the source zones of the subsequent component. The remaining sections 154 of the heavily doped layer 9" have no electrical function, and in the example are just a result of the production process.

Figure 47D:
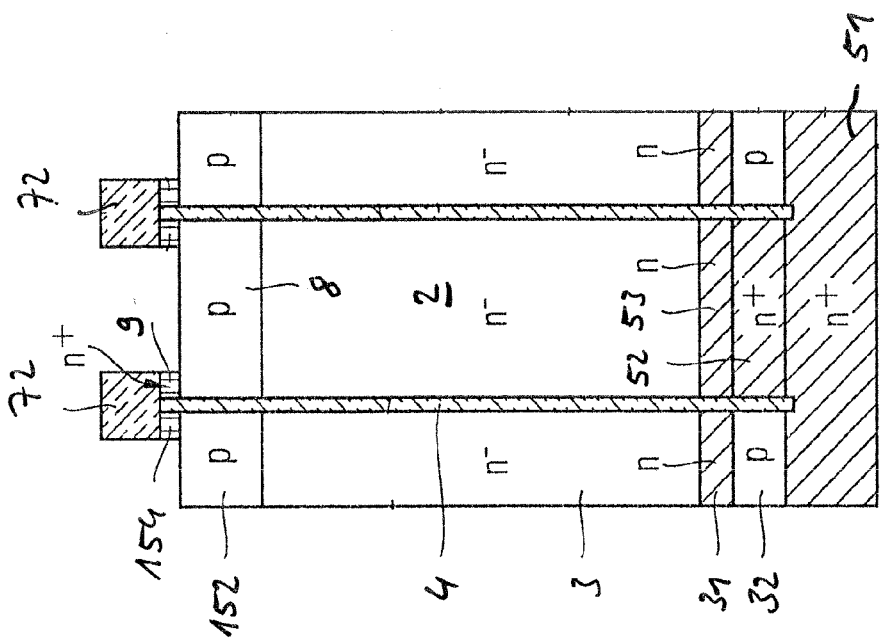

With reference to FIG. 47D, source electrodes 13 are finally produced above the body zones 8, and connecting zones 151 of the gate electrodes 15 are produced above the p-doped semiconductor zones of the gate electrodes 15. Before production of these electrodes 13, 151 semiconductor zones 81, 153 which are more heavily doped than the body zones 8 and the semiconductor zones 152 are optionally produced in the body zones 8 and semiconductor zones 152. These more heavily doped zones 81, 153 ensure a low-impedance connecting contact between the electrodes 13, 151 and the body zones 8 and the p-semiconductor zones 152. In the case of the semiconductor component illustrated in FIG. 47D, the source electrode 13 makes contact with the source zones 9 in areas in which the source zones 9 are connected to the source electrode 13 in the lateral direction.

A further method for production of a semiconductor component as illustrated in FIG. 47D will be explained in the following text with reference to FIGS. 48A to 48F. In this method, a semiconductor body 100 is first of all made available, whose heavily doped semiconductor substrate 51, for example an n-substrate, has a semiconductor layer 2' which is more lightly doped, is applied to the semiconductor substrate and forms the subsequent drift zone of the component, in places. Before production of the more lightly doped semiconductor layer 2', a more heavily doped semiconductor layer 53' is optionally applied to the semiconductor substrate 51.

Starting from the front face 101 of the semiconductor body, trenches 10 are then produced and extend into the semiconductor substrate 51 in the vertical direction. These trenches are produced in a manner which is known in principle by production of a mask 200 above the front face 101, followed by selective etching of the semiconductor body in areas which are exposed by the mask 200.

Figure 48B:
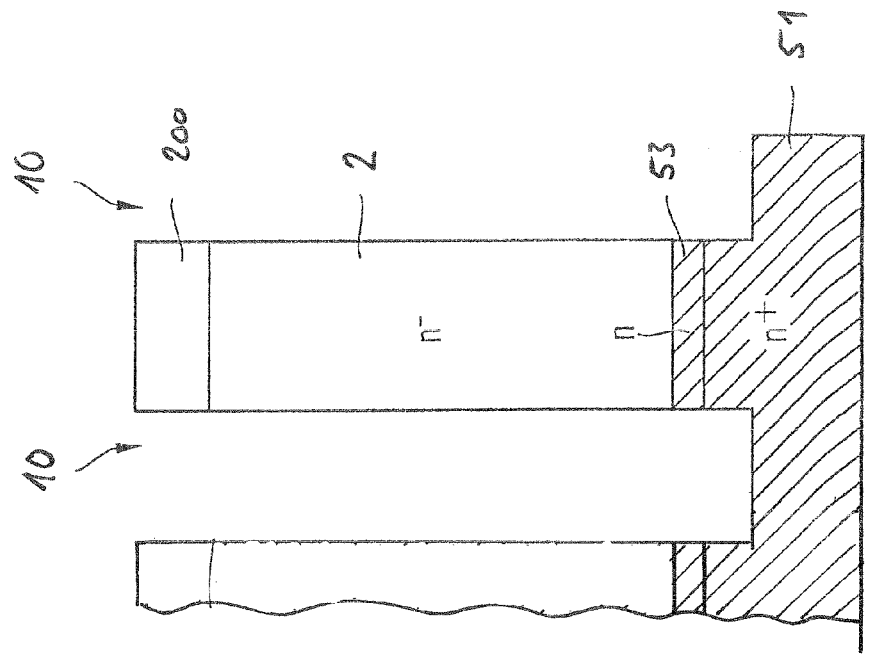
FIG. 48 illustrates a method for production of a further semiconductor component in the form of a MOSFET, in which the drift control zone is connected directly to the gate electrode, during individual method steps.
Figure 48A:
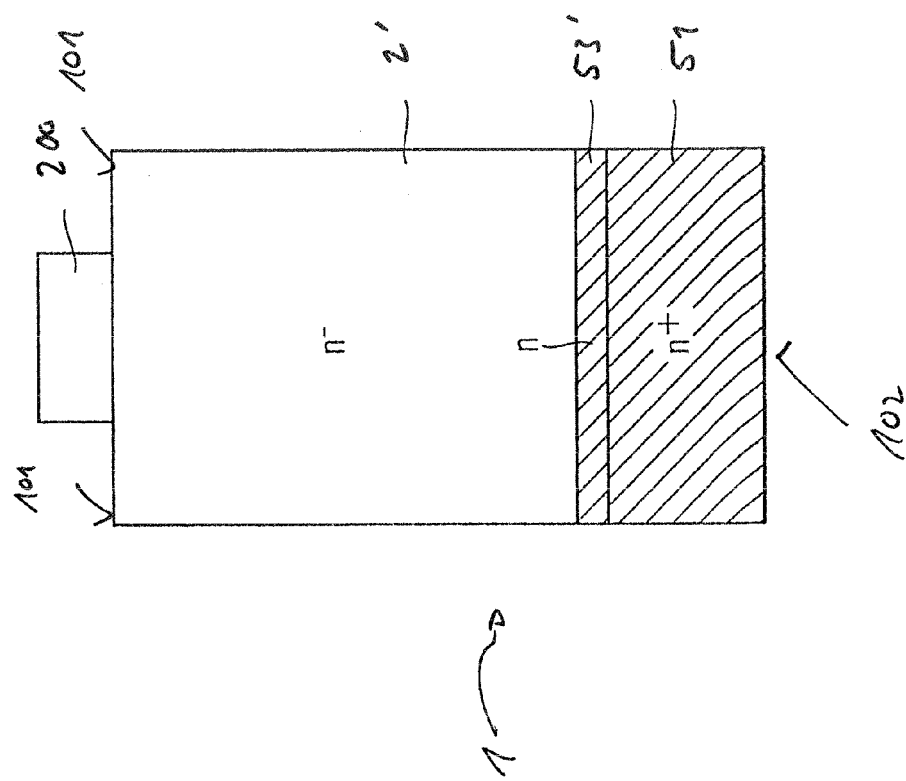
Figure 48D:
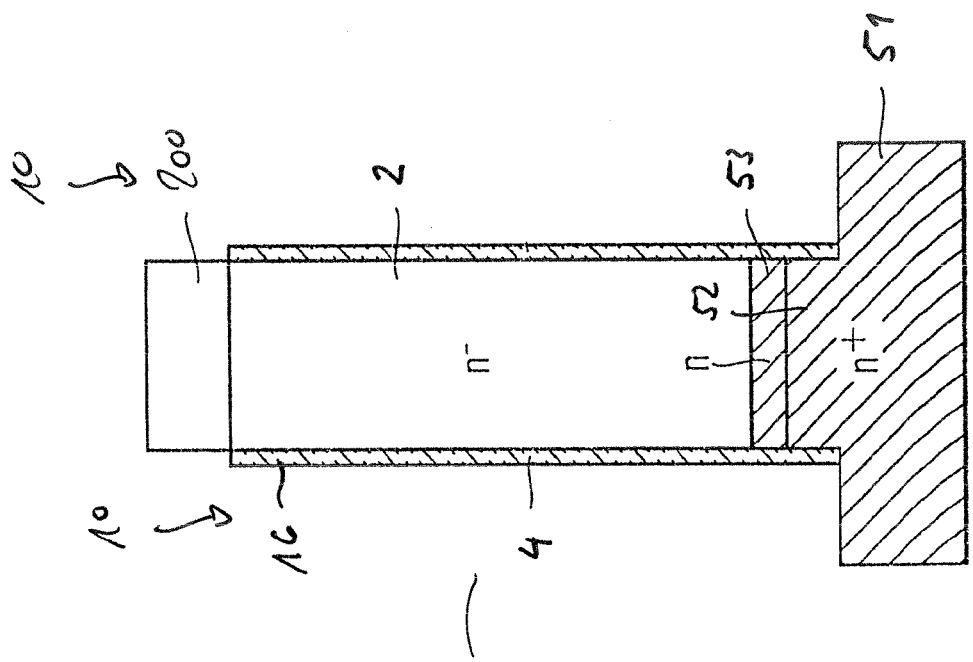
Figure 48C:
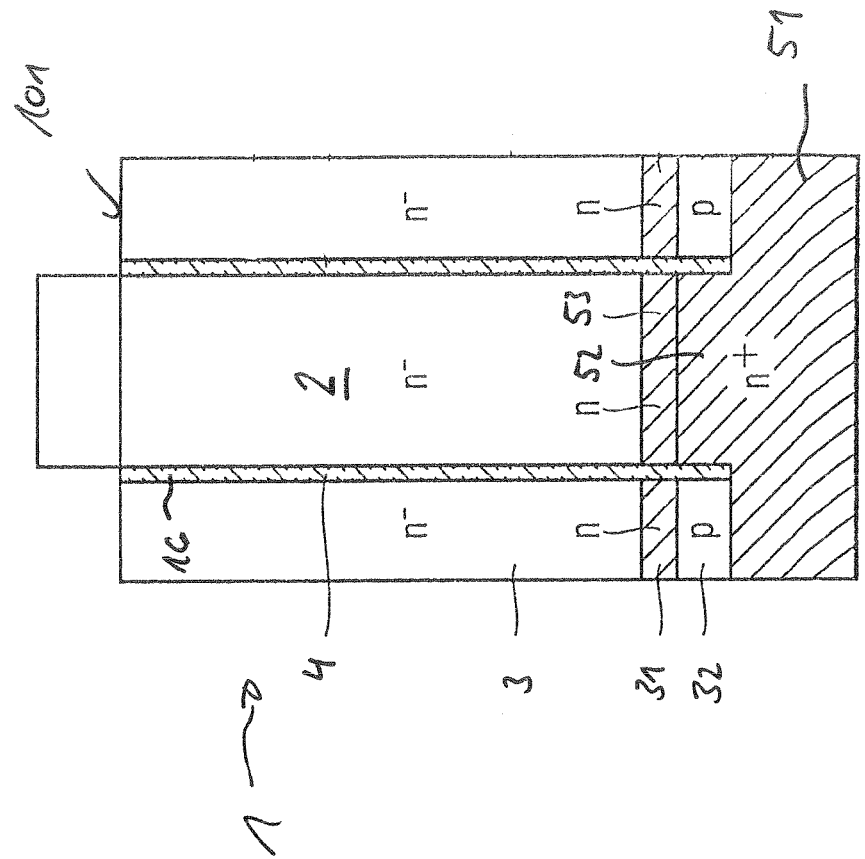

With reference to FIG. 48C, dielectrics are subsequently produced on side walls of the trenches 10 that have been produced in this way, and subsequently form the gate dielectric 16 and the accumulation dielectric 4. By way of example, this dielectric is produced on the side walls of the trenches 10 by thermal oxidation of the semiconductor body followed by removal of the oxide layer created in this process from the base of the trenches 10. An anisotropic etching process can be used to remove the oxide layer or dielectric layer from the base of the trenches 10.

With reference to FIG. 48D, a monocrystalline semiconductor material is then introduced into the trenches, having differently doped sections. This semiconductor material can be produced by means of an epitaxial process. This process results in the production of p-doped semiconductor sections 32 which are connected directly to the semiconductor substrate 51. A lightly n-doped semiconductor material is produced above the p-doped sections 32 and forms the subsequent drift control zone 3 in places. An n-doped semiconductor zone 31 which is more heavily doped than the drift control zone 3 and forms a part of the subsequent integrated diode can optionally be produced between the p zones 32 and the drift control zone 3.

Figure 48F:
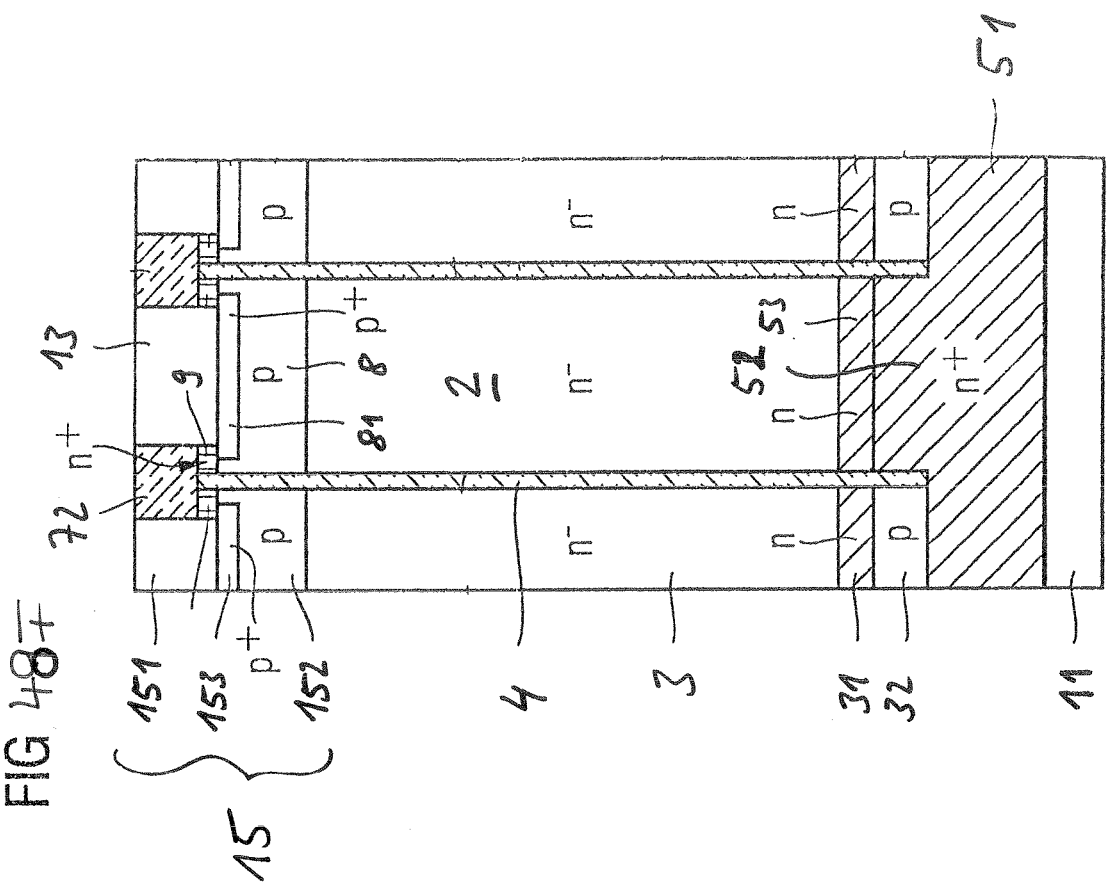
Figure 48E:
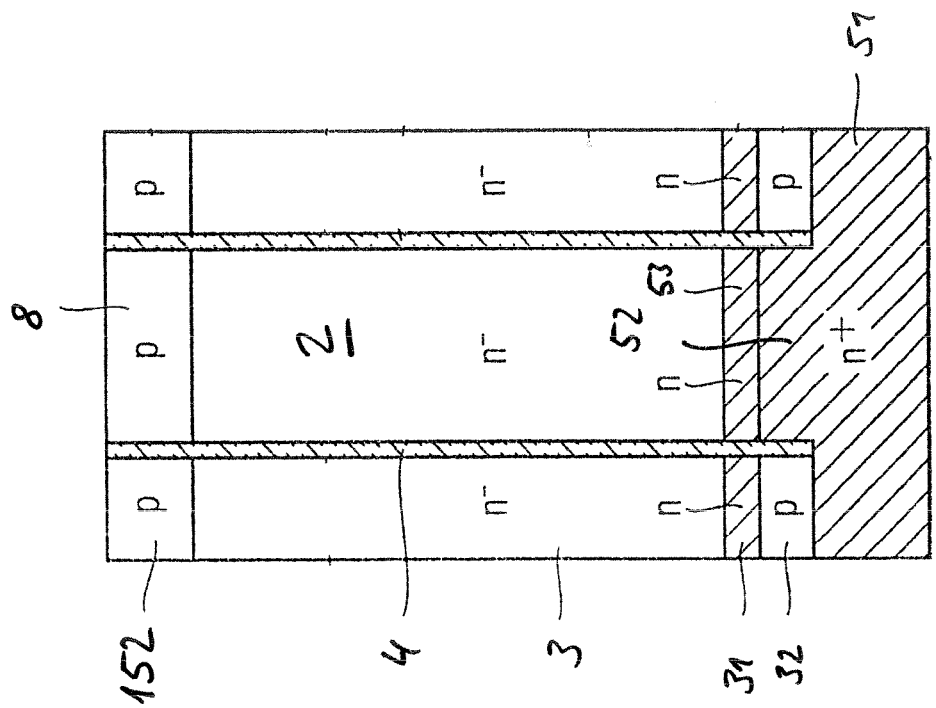

With reference to FIG. 48E, p-doped semiconductor zones 8, 152 are produced in the area of the front face 101 of the semiconductor body 1 created in this way, form the body zones 8 in the area above the drift zone 2, and form parts of the gate electrodes of the subsequent MOSFET above the drift control zone 3. By way of example, these p zones 8, 152 are produced by implantation of p-dopant atoms followed by an appropriate healing step.

The production of these p zones 8, 152 is followed by the method steps, as have already been explained with reference to FIGS. 47A to 47D, for production of the source zone 9 and for production of the source electrodes 13, and for completion of the gate electrodes 15. FIG. 48F illustrates a cross section through the finished component.

FIG. 49 illustrates a cross section through a modification of the MOSFET illustrated in FIG. 47D. In the case of the component illustrated in FIG. 49, the dielectric layer which forms the accumulation dielectric 4 in the area between the drift control zone 3 and the drift zone 2 and which forms the gate dielectric in the area between the gate electrode 15 and the body zone 8 is formed from a plurality of layers. This layer structure includes, for example, two oxide layers 4A, 4C which are connected directly to the drift zone 2 on one side of the trench and to the drift control zone 3 on the other side of the trench, as well as a dielectric layer 4B, which is arranged between the oxide layers and preferably has a higher dielectric constant than the two oxide layers 4A, 4C. The advantage of the dielectric layer being in the form of a layer stack with a plurality of dielectric layers is that, when using a dielectric material with a high dielectric constant, for example with a dielectric constant of more than 15, a broader trench can be provided for the production of the dielectric layer than if an oxide layer were to be used on its own, without detracting from the capacitive coupling between the drift control zone 3 and the drift zone 2.

FIG. 50 illustrates a modification of the component illustrated in FIG. 49. In the case of the component illustrated in FIG. 50, the multilayer dielectric layer extends from the front face 101 to the rear face 102 of the semiconductor body 100.

For a given voltage difference between the drift control zone 3 and the drift zone 2, the number of charge carriers which accumulate in the drift zone 2 is dependent on the accumulation capacitance which is formed by the drift zone 2, the drift control zone 3 and the accumulation dielectric 4. The accumulated charge in this case becomes greater as this capacitance increases. For a given thickness of the accumulation dielectric 4, this capacitance becomes greater the higher the dielectric constant of the accumulation dielectric. For a given accumulation capacitance, the required thickness of the accumulation dielectric decreases the lower the dielectric constant. If silicon dioxide ($SiO_2$) is used as the material for the accumulation dielectric, the accumulation dielectric typically requires a thickness of 200 nm or less in order to produce an adequate accumulation effect. Dielectric layers which are as thin as this and furthermore extend into the depth are difficult to produce.

In this case, one embodiment of the invention provides for the accumulation dielectric to be composed entirely or partially of a material with a medium dielectric constant, a medium-C material. A material such as this is distinguished by a relative dielectric constant of about 25. The use of a material such as this allows the use of an accumulation dielectric which is thicker than in the case of $SiO_2$, and is thus easier to produce. Suitable materials are, for example, silicon nitride (SiN), whose dielectric constant at 7.5 is approximately twice as high as that of $SiO_2$, or silicon carbide (SiC) whose dielectric constant of 9.7 is about 2.5 times as high as that of $SiO_2$. Instead of using high-dielectric-constant materials (high-C materials), the medium-C materials mentioned above can be produced by processes which are standard processes for the manufacture of semiconductor components.

In the case of the components already explained, the accumulation dielectric 4 may be composed entirely of a medium-C material.

In the case of the components illustrated in FIGS. 11, 49 and 50, the central one 4b of the dielectric layer may, for example, be composed of a medium-C material, and the two outer layers 4a, 4c may be produced from a material with a lower dielectric constant, for example from $SiO_2$. The central layer 4b may in this case be considerably thicker, for example thicker by a factor of 5 to 10, than the outer layers 4a, 4c.

Furthermore, it is also possible for the accumulation dielectric 4 between the drift zone 2 and the drift control zone 3 to be formed from a medium-C material, and for a dielectric which separates further areas of the component from one another to be produced from a material with a lower dielectric constant. Different areas such as these in the case of a component as illustrated in FIG. 19 are, for example, the body zone 8 and the connecting zone 33, which can be separated by a dielectric with a lower dielectric constant, or in the case of a component illustrated in FIG. 41, the connecting zone 31 and the drain zone 5, which can be separated by a dielectric with a lower dielectric constant.

In the case of a further variant relating to a component as illustrated in FIG. 16, the dielectric layer between the p-doped semiconductor zones 33, 34 and the body zone 8 and the short-circuit zone 17 can be formed by a medium-C material in order in this way to increase the internal storage capacitance of the component. The accumulation dielectric 4 between the drift zone 2 and the drift control zone 3 is in this case composed of a material with a lower dielectric constant. The accumulation dielectric 4 could also be formed by a medium-C material, although a high-C material would then have to be provided for the dielectric layer between the p-doped semiconductor zones 33, 34 and the body zone 8 and the short-circuit zone 17, in order to increase the internal storage capacitance.

What is claimed is:

1. A semiconductor component including a MOS transistor, comprising:
    a semiconductor body;
    a drift region of a semiconductor material in the semiconductor body;
    a drift control region composed of a semiconductor material, which is arranged, at least in sections, adjacent to the drift region in the semiconductor body and which is of a first conduction type, of a second conduction type complementary to the first conduction type, or which is intrinsic;
    an accumulation dielectric arranged between the drift region and the drift control region;
    a body region and a drain region arranged at a distance from the body region, between which the drift region is arranged, the drain region being of the first conduction type;
    a source region of a first conduction type which is separate from the drift region by the body region;
    a gate electrode, which is insulated from the semiconductor body by means of a gate dielectric and which extends adjacent to the body region from the source region as far as the drift region;
    a first rectifier element, via which the drift control region is coupled to the source region, a doped connection region of a second conduction type, via which the drift control region is coupled to the source region, the connection region having a connection electrode, and the first rectifier element being connected between the connection electrode and the source region; and
    a connection region of the first conduction type, which is adjacent to the drift control region and doped more highly than the drift control region, and a second rectifier element, the drift control region being coupled to the drain region via the connection region and the second rectifier element.

2. The semiconductor component according to claim 1, in which the drift control region has at least one semiconductor section doped in such a way that it can be fully depleted in a direction perpendicular to the accumulation dielectric.

3. The semiconductor component according to claim 1, which has a plurality of component structures of identical type arranged in the semiconductor body, each with a drift region and drift control region.

4. The semiconductor component according to claim 1, in which the drift control region is of a same conduction type as the drift region.

5. The semiconductor component according to claim 1, in which the drift control region is of a conduction type complementary to a conduction type of the drift region.

6. The semiconductor component according to claim 1, in which the drift region is intrinsic.

7. The semiconductor component according to claim 1, in which the body region is arranged at a distance from the drain region in a vertical direction of the semiconductor body.

8. The semiconductor component according to claim 1, in which the body region is arranged at a distance from the drain region in a lateral direction of the semiconductor body.

9. The semiconductor component according to claim 1, in which the drift control region and the drift region have a same net dopant concentration.

10. The semiconductor component according to claim 1, in which the drift region and the drift control region have an identical profile of a dopant concentration in a direction parallel to the accumulation dielectric.

11. The semiconductor component according to claim 1, in which the second rectifier element is a diode.

12. The semiconductor component according to claim 11, in which the diode is formed by a pn junction between the connection region that is doped more highly than the drift control region and a connection region of the second conduction type.

13. The semiconductor component according to claim 1, in which the first rectifier element is a diode.

14. The semiconductor component according to claim 1, in which a capacitive component is connected between the drift control region and the source region.

15. The semiconductor component according to claim 14, in which the capacitive component is integrated in the semiconductor body.

16. The semiconductor component according to claim 14, in which the body region and the source region are connected to one another by a source electrode and a semiconductor region that is of a same conduction type as the body region and is doped more highly than the body region, and in which the capacitive component is connected to the source electrode.

17. The semiconductor component according to claim 1, in which the body region forms together with the drift region a component junction proceeding from which a space charge region propagates in the drift region when a reverse voltage is applied between the drift region and the body region.

18. The semiconductor component according to claim 1, in which the drain region is of a same conduction type as the drift region.

19. The semiconductor component according to claim 1, in which the drift region is doped complementarily to the source region.

20. The semiconductor component according to claim 19, in which an intermediate region of a same conduction type as the source region is arranged between the drift region and the body region.

21. The semiconductor component according to claim 1, in which the gate electrode is arranged above a front side of the semiconductor body.

22. The semiconductor component according to claim 1, in which the gate electrode is arranged in a trench of the semiconductor body.

23. The semiconductor component according to claim 22, in which the gate electrode is arranged at a distance from the drift control region in a direction transversely with respect to a current flow direction of the component.

24. The semiconductor component according to claim 22, in which the gate electrode extends from the source region as far as the drift region in a vertical direction of the semiconductor body.

25. The semiconductor component according to claim 1, in which the gate electrode extends from the source region as far as the drift region in a first lateral direction of the semiconductor body.

26. The semiconductor component according to claim 25, in which the gate electrode is arranged adjacent to the drift control region in the first lateral direction.

27. The semiconductor component according to claim 1, in which the drift region has at least one compensation region doped complementarily to the drift region.

28. The semiconductor component according to claim 1, in which the drift control region is electrically coupled to the gate electrode.

29. The semiconductor component according to claim 28, in which the drift control region is coupled to the gate electrode via a third rectifier element.

30. The semiconductor component according to claim 1, which has a drain electrode making contact with the drain region, and in which, in sections, a semiconductor region doped complementarily to the drain region and the drift region is arranged between the drain electrode and the drift region.

31. The semiconductor component according to claim 1, in which the semiconductor body has a first lateral direction x and a second lateral direction y running perpendicular to the first lateral direction x, and in which the drift control region is arranged adjacent to the drift region at least in sections in the second lateral direction y in a manner separated by the accumulation dielectric.

32. The semiconductor component according to claim 31, which has a plurality of drift regions arranged at a distance from one another in the second lateral direction y, and a plurality of drift control regions arranged at a distance from one another in the second lateral direction.

33. The semiconductor component according to claim 1, in which the accumulation dielectric has at least two partial layers.

34. The semiconductor component according to claim 33, in which the accumulation dielectric has at least one partial layer having a relative permittivity of seven or greater.

35. A semiconductor component including a MOS transistor, comprising:
a semiconductor body;
a drift region,
a drift control region, and
an accumulation dielectric arranged between the drift region and the drift control region;
a body region, a drain region, a source region of a first conduction type which is separate from the drift region by the body region; and a gate electrode, which is insulated from the semiconductor body by means of a gate dielectric and which extends adjacent to the body region from the source region as far as the drift region;
a first rectifier element, via which the drift control region is coupled to the source region, a doped connection region of a second conduction type, via which the drift control region is coupled to the source region, the connection region having a connection electrode, and the first rectifier element being connected between the connection electrode and the source region; and
a connection region of the first conduction type, which is adjacent to the drift control region and doped more highly than the drift control region, and a second rectifier element, the drift control region being coupled to the drain region via the connection and the second rectifier element.

36. The semiconductor component according to claim 35, in which the semiconductor body has a vertical direction v, and in which the drift control region is arranged adjacent to the drift region at least in sections in the vertical direction v.

37. The semiconductor component according to claim 36, which has a plurality of drift regions arranged at a distance from one another in the vertical direction v, and a plurality of drift control regions arranged at a distance from one another in the vertical direction v.

38. The semiconductor component according to claim 35, in which the semiconductor body has a semiconductor substrate and a semiconductor layer arranged on the semiconductor substrate, the drift region and the drift control region being arranged in the semiconductor layer.

39. The semiconductor component according to claim 38, in which the drift region adjoins the semiconductor substrate, and in which an insulation layer is arranged between the drift control region and the semiconductor substrate.

40. The semiconductor component according to claim 39, in which the semiconductor substrate has a basic doping of one conduction type, and in which the semiconductor substrate has at least one semiconductor region that is of a conduction type complementary to the one conduction type of the basic doping.

41. The semiconductor component according to claim 38, in which an insulation layer is arranged between the semiconductor substrate and the drift region and the drift control region.

42. The semiconductor component according to claim 41, in which the semiconductor substrate has a basic doping of one conduction type, and in which the semiconductor substrate has, adjacent to the insulation layer, at least one semiconductor region that is of a conduction type complementary to the one conduction type of the basic doping.

43. The semiconductor component according to claim 42, in which the semiconductor region doped complementarily to the basic doping is connected to the body region via a connecting region.

44. The semiconductor component according to claim 43, which has a plurality of semiconductor regions which are doped complementarily to the basic doping of the semiconductor substrate and which are arranged at a distance from one another in a first lateral direction and one of which is connected to the connecting region.

45. The semiconductor component according to claim 44, in which a doping dose of the semiconductor region doped complementarily to the basic doping of the semiconductor substrate decreases in the first lateral direction.

* * * * *